(12) United States Patent
Evans et al.

(10) Patent No.: US 11,591,710 B2
(45) Date of Patent: Feb. 28, 2023

(54) CRYSTALLIZATION OF AMORPHOUS MULTICOMPONENT IONIC COMPOUNDS

(71) Applicant: Wisconsin Alumni Research Foundation, Madison, WI (US)

(72) Inventors: Paul Gregory Evans, Madison, WI (US); Thomas Francis Kuech, Madison, WI (US); Susan Elizabeth Babcock, Madison, WI (US); Mohammed Humed Yusuf, Madison, WI (US); Yajin Chen, Madison, WI (US)

(73) Assignee: Wisconsin Alumni Research Foundation, Madison, WI (US)

( * ) Notice: Subject to any disclaimer, the term of this patent is extended or adjusted under 35 U.S.C. 154(b) by 26 days.

(21) Appl. No.: 17/060,585

(22) Filed: Oct. 1, 2020

(65) Prior Publication Data
US 2021/0025074 A1    Jan. 28, 2021

Related U.S. Application Data

(63) Continuation of application No. 15/728,595, filed on Oct. 10, 2017, now abandoned.

(51) Int. Cl.
*C30B 1/02* (2006.01)
*C30B 29/22* (2006.01)
(Continued)

(52) U.S. Cl.
CPC .............. *C30B 1/023* (2013.01); *C30B 29/22* (2013.01); *C30B 29/32* (2013.01);
(Continued)

(58) Field of Classification Search
CPC ......... C30B 1/023; C30B 29/22; C30B 29/32; H01L 21/02197; H01L 21/02266; H01L 21/02356; H01L 29/40111; H01L 29/6684
See application file for complete search history.

(56) References Cited

U.S. PATENT DOCUMENTS

2002/0151115 A1* 10/2002 Nakajima ........... H01L 21/0242
                                                                438/149
2005/0230759 A1* 10/2005 Shimizu ............ H01L 21/28194
                                                                257/368
(Continued)

OTHER PUBLICATIONS

ACS Nano, vol. 8, No. 6, pp. 6145-6150 and supporting information (Year: 2014).*

*Primary Examiner* — Hua Qi
(74) *Attorney, Agent, or Firm* — Bell & Manning, LLC

(57) ABSTRACT

A method for crystallizing an amorphous multicomponent ionic compound comprises applying an external stimulus to a layer of an amorphous multicomponent ionic compound, the layer in contact with an amorphous surface of a deposition substrate at a first interface and optionally, the layer in contact with a crystalline surface at a second interface, wherein the external stimulus induces an amorphous-to-crystalline phase transformation, thereby crystallizing the layer to provide a crystalline multicomponent ionic compound, wherein the external stimulus and the crystallization are carried out at a temperature below the melting temperature of the amorphous multicomponent ionic compound. If the layer is in contact with the crystalline surface at the second interface, the temperature is further selected to achieve crystallization from the crystalline surface via solid phase epitaxial (SPE) growth without nucleation.

16 Claims, 13 Drawing Sheets

(51) Int. Cl.
*H01L 21/02* (2006.01)
*C30B 29/32* (2006.01)
*H01L 29/66* (2006.01)
*H01L 21/28* (2006.01)

(52) U.S. Cl.
CPC .. *H01L 21/02197* (2013.01); *H01L 21/02266* (2013.01); *H01L 21/02356* (2013.01); *H01L 29/40111* (2019.08); *H01L 29/6684* (2013.01)

(56) References Cited

U.S. PATENT DOCUMENTS

| | | | |
|---|---|---|---|
| 2008/0264332 A1* | 10/2008 | Sepehry-Fard | C30B 1/026 117/202 |
| 2010/0059724 A1* | 3/2010 | Lubomirsky | H01L 37/025 252/520.21 |
| 2016/0068990 A1* | 3/2016 | Spanier | C23C 16/409 117/8 |
| 2017/0199307 A1* | 7/2017 | Hart | G02B 1/11 |

* cited by examiner

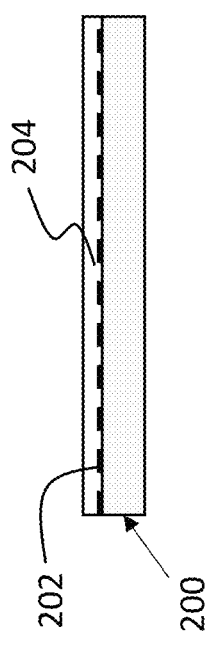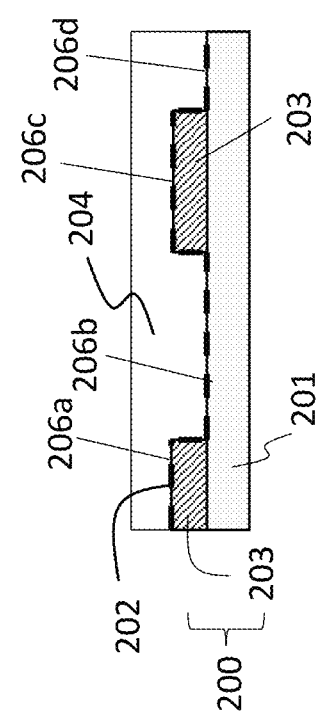
FIG. 2A
FIG. 2B

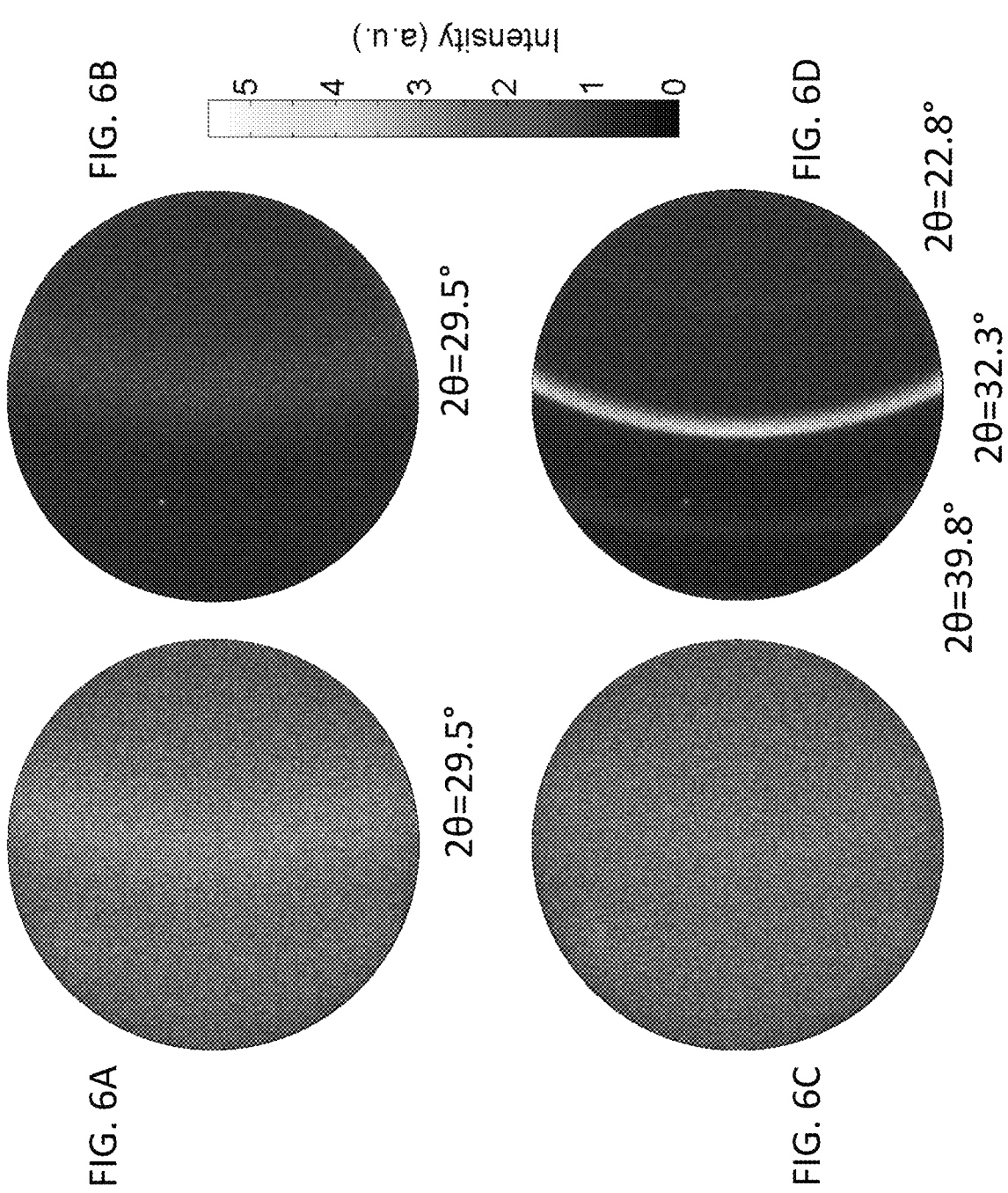

US 11,591,710 B2

CRYSTALLIZATION OF AMORPHOUS MULTICOMPONENT IONIC COMPOUNDS

CROSS-REFERENCE TO RELATED APPLICATIONS

The present application is a continuation of U.S. patent application Ser. No. 15/728,595 that was filed Oct. 10, 2017, the entire contents of which are hereby incorporated by reference.

REFERENCE TO GOVERNMENT RIGHTS

This invention was made with government support under 1121288 awarded by the National Science Foundation. The government has certain rights in the invention.

BACKGROUND

Considerable effort has been devoted to the synthesis of crystalline complex oxides using methods that provide low defect densities while simultaneously providing control over the shape, crystallographic orientation and elemental composition of nanomaterials. The creation of thin layers of oxide single-crystals largely employs epitaxial growth techniques from the vapor phase, which relies on elevated surface temperatures to favor kinetic processes including long-range surface diffusion. (D. G. Schlom, L. Q. Chen, X. Q. Pan, A. Schmehl, M. A. Zurbuchen, "A thin film approach to engineering functionality into oxides," J. Am. Ceram. Soc. 91, 2429-2454 (2008) and J. L. MacManus-Driscoll, "Self-Assembled Heteroepitaxial Oxide Nanocomposite Thin Film Structures: Designing Interface-Induced Functionality in Electronic Materials," Adv. Funct. Mater. 20, 2035-2045 (2010).) Growth via epitaxial techniques based on elemental or chemical sources is, however, constrained to planar substrates by line-of-sight geometric considerations, yielding two-dimensional thin-film heterostructures.

The three-dimensional integration of complex oxide crystals in intricate nanoscale geometries can enable new applications of complex oxides in oxygen transport, in single crystal composites for the control of thermal properties, and by yielding complex oxides in sufficient volume or numbers of nanostructures in which mechanical, optical, and electronic effects are modified by size effects.[4-5] The promising properties of nanoscale complex oxide materials have been discovered and studied at the scale of individual structures,[6] but at present routes to the areas on the order of square centimeters incorporating a large number of nanostructures required for applications are lacking. In addition, two-dimensional electron gases have potentially widespread applications in nanoscale geometries, but can presently be synthesized only in two-dimensional geometries in epitaxial systems based on complex oxide single-crystal substrates.[7,8] Controlling the nucleation and growth of complex oxides, in sophisticated geometries, remains an open challenge.

SUMMARY

Provided are methods for crystallizing amorphous multicomponent ionic compounds (e.g., multicomponent oxides such as perovskite oxides,) which have been previously deposited on amorphous surfaces (e.g., a surface of a plastic substrate), including in the form of intricate, three-dimensional structures.

In an embodiment, a method for crystallizing an amorphous multicomponent ionic compound comprises applying an external stimulus to a layer of an amorphous multicomponent ionic compound, the layer in contact with an amorphous surface of a deposition substrate at a first interface. Optionally, the layer is in contact with a crystalline surface at a second interface. The external stimulus induces an amorphous-to-crystalline phase transformation, thereby crystallizing the layer to provide a crystalline multicomponent ionic compound. The external stimulus and the crystallization are carried out at a temperature below the melting temperature of the amorphous multicomponent ionic compound. If the layer is in contact with the crystalline surface at the second interface, the temperature is further selected to achieve crystallization from the crystalline surface via solid phase epitaxial (SPE) growth without nucleation.

The following is a non-exhaustive list of abbreviations used in the present disclosure: solid phase epitaxy (SPE), transmission electron microscope (TEM), X-ray reflectivity (XRR), two-dimensional electron (hole) gas (2DE(H)G).

Other principal features and advantages of the invention will become apparent to those skilled in the art upon review of the following drawings, the detailed description, and the appended claims.

BRIEF DESCRIPTION OF THE DRAWINGS

Illustrative embodiments of the invention will hereafter be described with reference to the accompanying drawings, wherein like numerals denote like elements.

FIG. 2A shows a side view of a schematic of a deposition substrate providing a single region, an amorphous surface. FIG. 2B shows a side view of a schematic of another deposition substrate providing a plurality of regions, including amorphous and crystalline surfaces.

FIG. 3 also illustrates crystallization of an amorphous layer via SPE growth on the deposition substrate.

FIGS. 4A-4D also illustrate the crystallization of an amorphous layer via SPE growth on the deposition substrate to form a complex, three-dimensional (3D) crystalline structure.

FIGS. 6A-6D show X-ray scattering patterns. FIG. 6A shows amorphous STO on (001) STO. FIG. 6B shows amorphous STO on $SiO_2$/(001) Si, with a ring of scattering from amorphous STO at a at 2θ angle of 29.5°. FIG. 6C shows crystallized STO on (001) STO. FIG. 6D shows crystallized STO on $SiO_2$/(001) Si. Rings of powder diffraction intensity at 2θ angles of 22.8°, 32.3°, and 39.8° appear following crystallization on $SiO_2$/(001) Si.

DETAILED DESCRIPTION

Figure 1:
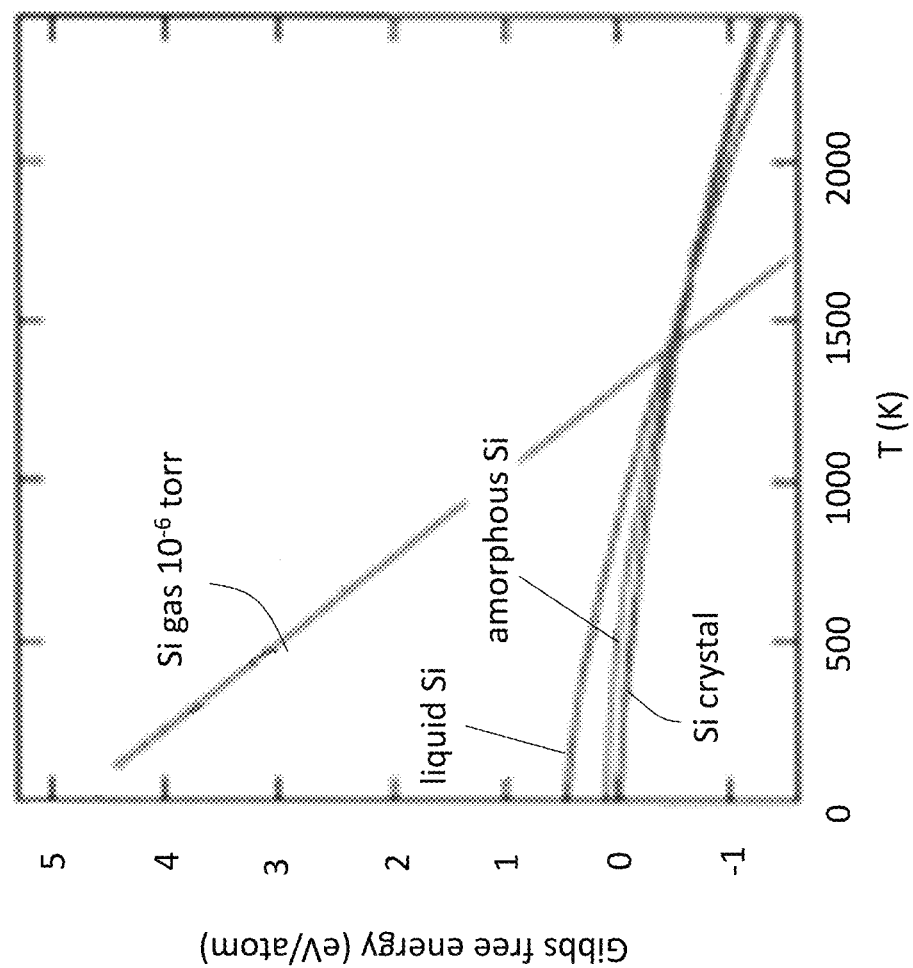
FIG. 1 illustrates the thermodynamics of the different phases of silicon (Si). This graph was redrawn from J. Y. Tsao, Materials Fundamentals of Molecular Beam Epitaxy, 1993.

Provided are methods for crystallizing amorphous multicomponent ionic compounds (e.g., multicomponent oxides such as perovskite oxides,) which have been previously deposited on amorphous surfaces (e.g., a surface of a plastic substrate), including in the form of intricate, three-dimensional structures.

By "multicomponent ionic compound" it is meant a chemical compound comprising a first type of cation, a first type of anion, and at least one additional type of cation, at least one additional type of anion, or both. Thus, binary ionic compounds composed of cations of a first type and anions of a second type are not multicomponent ionic compounds. Rather, multicomponent ionic compounds include ternary compounds, quaternary compounds, etc. By way of illustration, a multicomponent ionic compound may be a chemical compound composed of two types of cations and one type of anion, three types of cations and one type of anion, or one type of cation and two types of anions. The stoichiometry of the various cations and anions may vary in the compound, depending upon the desired composition. In embodiments, the anions of the first type are oxygen anions such that the multicomponent ionic compound may be referred to as a multicomponent oxide. In embodiments, the multicomponent oxide does not comprise any anions of a different type (i.e., it comprises only oxygen anions).

Illustrative multicomponent oxides include perovskite oxides (which may also be referred to as "perovskites"). Perovskite oxides include those characterized by formula $ABO_3$. The valences of the A-site and B-site cations have a sum of +6. The A-site and B-site cations may be selected from various metallic elements. By way of illustration, the A-site cations may be selected from alkaline earth elements, rare earth elements, and post-transition metal elements. B-site cations may be selected from transition metal elements (e.g., 3d transition metal elements) and post-transition metal elements. Specific illustrative perovskite oxides include $SrTiO_3$, $BaTiO_3$, $PbTiO_3$, $BaSnO_3$, $BiFeO_3$, and $LaAlO_3$.

Perovskite oxides which exhibit layered structures upon crystallization may also be used. By way of illustration, perovskite oxides which exhibit a Ruddlesden-Popper phase upon crystallization may be used. Some of the compounds within this series are characterized by formula $(A_{1-x}A'_x)_2BO_{4\pm\delta}$. The A-site and B-site cations may be selected from various metallic elements as described above with respect to perovskite oxides. An illustrative example is $(La_{1-x}Sr_x)_2BO_{4\pm\delta}$, where B is selected from Co, Ni and Cu.

Other illustrative multicomponent oxides include ferrites and spinels. Ferrites are compounds composed of iron oxide combined chemically with one or more additional metallic elements. Ferrites include compounds characterized by formula $A^{n+}(FeO_x)^{n-}$, wherein A is a metallic element (e.g., a transition metal element or an alkaline earth element). Ferrites include compounds characterized by formula $A^{2+}(Fe_xO_y)^{2-}$ where A is any divalent metallic ion. Many spinels are ferrites, including $NiFe_2O_4$, $MnFe_2O_4$, and $CoFe_2O_4$. Other specific illustrative ferrites include $BaFe_2O_{19}$ and $SrFe_{12}O_{19}$. Other spinels include those characterized by formula $AB_2O_4$ (see above) as well as those characterized by formula $ABCO_4$. The A-site, B-site, and C-site cations may be selected from various metallic elements as described above with respect to perovskite oxides. Another specific illustrative spinel is $ScAlMgO_4$.

Other illustrative multicomponent oxides include pyrochlores. Pyrochlores are characterized by formula $A^{3+}_2B^{4+}_2O_7$ or $A^{2+}_2B^{5+}_2O_7$. Pyrochlores can also incorporate oxygen vacancies, leading to a chemical formula $A_2B_2O_{6+x}$, wherein x ranges between 0 and 1 and the valences of the A-site and B-site cations are as indicated in the pyrochlore formulas above. The A-site, B-site cations may be selected from various metallic elements as described above with respect to perovskite oxides. Pyrochlores also include pyrochlore iridates characterized by formula $A_2Ir_2O_7$. In embodiments, A is selected from a rare earth element, e.g., selected from Pr, Nd, Eu, and Tb.

In each of the formulas described above, the A-site, B-site and C-sites may be occupied by more than one type of the respective cation. That is, the A-site may be occupied by more than one type of A-site cation (e.g., a mixture of $Sr^{2+}$ and $Ba^{2+}$); the B-site may be occupied by more than one type of B-site cation; and the C-site may be occupied by more than one type of C-site cation.

Other illustrative multicomponent oxides include substitutional alloys of $Al_2O_3$ in which some Al cations are substituted with another metallic cation, some O anions are substituted with another anion, or both.

At least some embodiments of the present methods may be used to provide crystalline multicomponent ionic compounds having compositions which are not possible with conventional crystallization techniques. Conventional crystallization techniques typically involve temperatures at which atomic surface diffusion and mass transport leads to phase decomposition/separation, thereby preventing formation of the desired composition, i.e., the desired stoichiometry, or desired crystal structure. Such conventional techniques include epitaxial growth techniques in which deposition/crystallization occurs simultaneously, such as high temperature pulsed laser deposition (PLD), high temperature magnetron sputtering, and chemical vapor deposition (CVD). By way of illustration, formation of crystalline pyrochlore iridates using conventional epitaxial growth techniques is highly challenging due to the low reactivity of metallic iridium and the volatility of iridium peroxides. Compositional analysis of thin films grown in situ at high temperatures by PLD from a stoichiometric $Eu_2Ir_2O_7$ target have revealed the absence of Ir or significant Ir deficiency.[10-12] Other conventional techniques which separate deposition and crystallization make use of relatively low temperatures for deposition, but relatively high temperatures for crystallization (including temperatures sufficient to melt/ liquefy the deposited material), including rapid thermal processing such as flash heating, laser annealing and congruent melting. Again, the atomic diffusion/mass transport at these higher temperatures can prevent formation of the desired composition/crystal structure. This means that the as-deposited composition of the material will not be the same as the crystallized composition.

By contrast, and as further described below, the present methods involve significantly lower temperatures, temperatures at which atomic diffusion/mass transport is sufficiently suppressed to minimize and even prevent phase decomposition/separation during deposition and, at least in some embodiments, crystallization. In this way, a selected composition can be deposited on the amorphous surface and then subsequently crystallized, wherein the crystallized composition is the same as the as-deposited composition (i.e., the selected composition). "The same" means "substantially the same" in recognition of the fact that there may be deviations of the stoichiometry of the crystallized composition from the stoichiometry of the as-deposited/selected composition, but that these deviations are so small that the properties of the crystallized composition are those consistent with the crystallized form of a composition having the stoichiometry of the as-deposited/selected composition. The stoichiometry of the crystallized composition may be determined via x-ray photoelectron spectroscopy (XPS), Rutherford backscattering spectrometry (RBS), or electron probe microanalysis (EPMA).

As noted above, the multicomponent ionic compounds are amorphous prior to crystallization. By "amorphous" it is meant the non-crystalline, metastable arrangement of atoms within the multicomponent ionic compound characterized by the lack of long-range order of the atomic components. By way of illustration, FIG. 1 illustrates the thermodynamics of the different phases of silicon (Si), i.e., gas, liquid, amorphous and crystalline, as a function of temperature. In this figure, "amorphous Si" is analogous to the present amorphous multicomponent ionic compounds. The existence of the amorphous phase of the multicomponent ionic compounds may be confirmed using standard X-ray diffraction and scattering techniques, including those described in the Example, below. The amorphous multicomponent ionic compounds may also be characterized as being homogenous, by which it is meant that the stoichiometry of the as-deposited amorphous multicomponent ionic compound is the same throughout the material. "The same" means "substantially the same" wherein "substantially" has a meaning analogous to the meaning described above.

A variety of techniques may be used to deposit amorphous multicomponent ionic compounds on amorphous surfaces. Illustrative techniques include atomic layer deposition (ALD), pulsed laser deposition (PLD) and magnetron sputtering. As described above, the temperatures used during deposition are those at which atomic diffusion/mass transport are sufficiently suppressed to minimize and even prevent phase decomposition/separation of the selected multicomponent ionic compound. In embodiments, the temperature is less than the melting temperature of the selected amorphous surface, as further described below. In embodiments, the temperature is less than about 300° C. This includes embodiments in which the temperature is less than about 250° C., less than about 200° C., less than about 150° C., less than about 100° C., less than about 50° C., or even room temperature (i.e., from about 20 to 25° C.).

The ALD technique provides compositional and chemical versatility as well as extreme conformality, allowing for uniform deposition over highly irregular shapes. Parameters for using ALD to provide amorphous multicomponent ionic compounds, including single phases, alloys, and multi-phase mixtures, may be found in, or adapted from, the following (each of which is incorporated by reference in its entirety): Miikkulainen et al., J. Appl. Phys. 113, 021301 (2013);[13] Laskar et al., ACS Appl. Mater. Interf. 8, 10572 (2016);[14] Vehkamaki et al., Chem. Vapor. Dep. 7, 75 (2001);[15] Hwang et al., J. Electrochem. Soc. 154, G69 (2007);[16] and Marchand et al., J. Phys. Chem. C 120, 7313 (2016).

The PLD and magnetron sputtering techniques also allow the creation of materials with highly precise control of the metal ion composition. By way of illustration, co-sputter deposition or PLD using a $A_2Ir_2O_7$ target (wherein A is selected from lanthanide or rare earth elements) and an Ir target may be used to provide amorphous $Ln_2Ir_2O_7$. The flux control of the additional Ir source allows precise control of the composition of the as-deposited material. Parameters for using magnetron sputtering to provide amorphous multicomponent ionic compounds are further described in the Example, below. The composition of the amorphous multicomponent ionic compound deposited by sputtering or PLD can be selected by choosing the composition of the material used as the target in the sputtering or PLD sources and by adjusting deposition parameters such as background gas pressure, sputtering RF power, or PLD optical fluence. Amorphous perovskite oxides, e.g. $SrTiO_3$, can be deposited by radiofrequency (RF) sputtering of a stoichiometric target onto a substrate held at room temperature using appropriate gas environments, for example a mixture of appropriate Ar and oxygen.[17]

The deposition step provides a layer of the amorphous multicomponent ionic compound on the amorphous surface. The thickness of the as-deposited material is not particularly limited. The thickness of the as-deposited material refers to the dimension of the as-deposited material as measured from the upper surface of the as-deposited material to the upper surface of the amorphous surface, along an axis normal to the amorphous surface. In embodiments, the thickness is at least about 5 nm, at least about 10 nm, at least about 20 nm, at least about 50 nm, at least about 75 nm, at least about 100 nm, at least about 150 nm, at least about 200 nm, at least about 250 nm, or at least about 500 nm. The other dimensions of the as-deposited material, i.e., those measured parallel to the amorphous surface, are also not particularly limited. However, these other dimensions may be significantly greater than the thickness of the as-deposited material, e.g., a 100 nm-thick layer of amorphous multicomponent ionic compound having a width and length on the order of microns or centimeters. Thus, the shape of the as-deposited material, i.e., as seen from a top, plan view, is not particularly limited. In addition, the as-deposited material may be patterned using standard lithographic techniques into a variety of shapes as desired, prior to crystallization.

The amorphous surface onto which the amorphous multicomponent ionic compound is deposited is provided by a deposition substrate. By "amorphous surface" it is meant a non-crystalline surface characterized by the lack of long-range order. Epitaxial growth is not possible from such amorphous surfaces. As illustrated in FIGS. 2A-2B (showing a side-view), a deposition substrate 200 has an upper surface 202 (emphasized by a dotted line) which forms the interface with the as-deposited amorphous multicomponent ionic compound 204. In the embodiment shown in FIG. 2A, the upper surface 202 of the deposition substrate 200 defines a single region, i.e., the amorphous surface onto which an amorphous multicomponent ionic compound 204 is deposited. This may be accomplished by using deposition substrates composed of an amorphous material. A variety of amorphous materials may be used, e.g., silica, other oxides or other glasses.

In embodiments, the amorphous material is an amorphous plastic. Illustrative amorphous plastics include polysulfone, polyimide, polyetherimide, polyethersulfone, polyarylsulfone, polyarylethersulfone, polycarbonate, polyphenylene oxide, polyphenylene ether, thermoplastic polyurethane, acrylic, polystyrene, acrylonitrile butadiene styrene, polyvinyl chloride, polyethylene terephthalate, cellulose acetate butyrate, and polytetrafluoroethylene.

In embodiments, the amorphous material (e.g., an amorphous plastic) is characterized by a melting temperature of about 400° C. or less. This includes embodiments in which the amorphous material is characterized by a melting temperature of about 300° C. or less, about 250° C. or less, about 200° C. or less, or about 150° C. or less. This includes embodiments in which the amorphous material is polyimide characterized by a melting temperature of about 400° C. or less; polyethylene terephthalate characterized by a melting temperature of about 300° C. or less; polyetherimide, polyethersulfone, polystyrene or cellulose acetate butyrate, each characterized by a melting temperature of about 250° C. or less; polysulfone, polyarylsulfone, polyarylethersulfone or acrylic, each characterized by a melting temperature of about 200° C. or less; or polycarbonate, polyphenylene oxide, polyphenylene ether, thermoplastic polyurethane, acrylonitrile butadiene styrene or polyvinyl chloride, each characterized by a melting temperature of about 150° C. or less.

In other embodiments such as the embodiment shown in FIG. 2B, the upper surface 202 (emphasized by a dotted line) of the deposition substrate 200 defines a plurality of regions 206a-d. Then, the amorphous surface onto which the amorphous multicomponent ionic compound 204 is deposited is just one of the regions of the plurality of regions 206a-d. The plurality of regions 206a-d may include crystalline surfaces (e.g., 206a and 206c) in addition to amorphous surfaces (e.g., 206b and 206d). The amorphous surfaces 206b, 206d may be provided via an amorphous material 201 (e.g., an amorphous plastic), while the crystalline surfaces 206a, 206c may be provided via a crystalline material 203 on the upper surface of the amorphous material 201. The deposition substrate 200 comprises the amorphous material 201 and the crystalline material 203.

Figure 3:
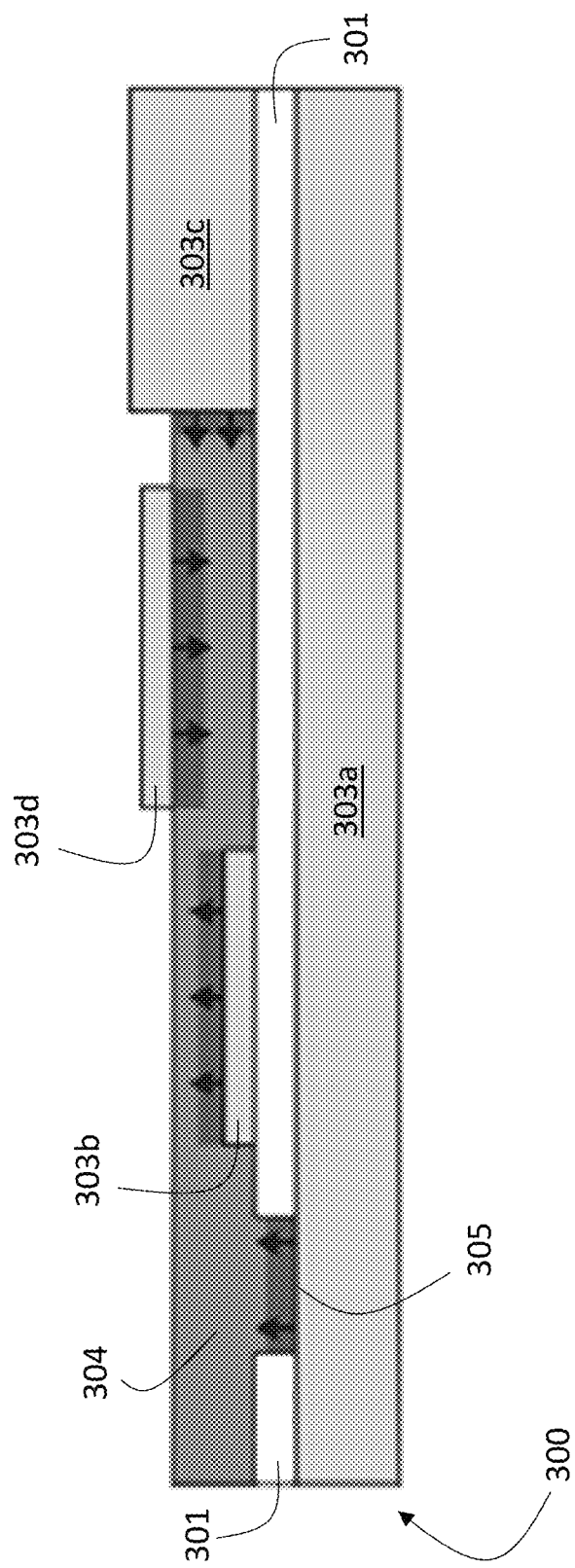
FIG. 3 shows a side view of another deposition substrate providing a plurality of regions, including amorphous and crystalline surfaces.

Another embodiment of a deposition substrate 300 defining a plurality of regions is illustrated in FIG. 3 (showing a side-view). Crystalline surfaces of the plurality of regions may be provided by depositing and/or patterning an amorphous material 301 on the upper surface of a crystalline material 303a. A crystalline surface may be provided via an exposed region 305 of the underlying crystalline material 303a. Other crystalline surfaces may also be provided by crystalline material 303b, 303c deposited onto the overlying amorphous material 301. In either case, as further described below, the crystalline surfaces provide crystalline seeds or templates from which SPE growth into the amorphous multicomponent ionic compound 304 can proceed (illustrated via the arrows/shading). The amorphous surfaces provided by the amorphous material 301 provide a mask over which nucleation within the amorphous multicomponent ionic compound 304 can be minimized and even prevented during the SPE growth. Finally, FIG. 3 also shows that another crystalline material 303d may be deposited onto the amorphous multicomponent ionic compound 304 after deposition, prior to crystallization. The deposition substrate 300 comprises the crystalline material 303a-c and the amorphous material 301.

The crystalline material of the deposition substrates may be a single-crystalline material, thereby providing single-crystalline surfaces. The composition of the crystalline material may be selected depending upon the selected composition of the multicomponent ionic compound. In embodiments, the compositions are the same, i.e., the crystalline material is the multicomponent ionic compound in a crystalline phase. In embodiments, the compositions are not the same, but the compositions are lattice-matched. "Lattice-matched" means "substantially lattice-matched" wherein in "substantially" has a meaning analogous to the meaning described above.

After deposition of the amorphous multicomponent ionic compound, crystallization is accomplished by applying an external stimulus sufficient to induce an amorphous-to-crystalline phase transformation to convert the amorphous multicomponent ionic compound to a crystalline phase. This amorphous-to-crystalline phase transformation may be a direct phase transformation, i.e., as opposed to indirect amorphous-to-liquid-to-crystalline phase transformations induced by rapid thermal processing using temperature sufficiently high to melt/liquefy the amorphous material. The term "crystallization" refers to the complete conversion of the amorphous phase to the crystalline phase. "Complete conversion" means "substantially complete conversion" wherein "substantially" has a meaning analogous to the meaning described above. As further described below, the mechanism by which crystallization is accomplished in the present methods can vary, e.g., crystallization via SPE growth versus crystallization via nucleation. In embodiments, crystallization is accomplished only via SPE growth.

A variety of external stimuli may be used, including thermal, mechanical, or combinations thereof. Thermal stimulus includes heating the amorphous multicomponent ionic compound to a temperature sufficient to induce the phase transformation. The heating may be accomplished various ways, including by using an oven or a furnace. Selection of the temperature is further described below. In at least some embodiments, the heating is uniform throughout the amorphous multicomponent ionic compound, i.e., as opposed to heating localized to distinct regions in the amorphous multicomponent compound. In other embodiments, the heating may be localized as when using lasers or high intensity lamps.

Mechanical stimulus includes applying a mechanical force to the amorphous multicomponent ionic compound. Mechanical force can be applied by deforming (e.g., via bending, rolling, etc.) the amorphous multicomponent ionic compound or the deposition substrate on which it is deposited. In an illustrative embodiment, a scanning probe microscope (SPM) tip can be used to mechanically write nanoscale crystalline regions on the surface of the amorphous multicomponent ionic compound upon the application of a very high vertical tip force, following procedures described for the crystallization of poly(ethylene oxide) melt droplets.[18] Electron-beam-induced crystallization can be induced using a beam of electrons focused within the region of an amorphous-crystalline interface.[19] The crystallization induced by the electron beam proceeds from the amorphous-crystalline interface.

Various considerations (or combinations thereof) guide selection of the temperature used to provide the thermal stimulus or the temperature used during other stimuli. In the Example, below, which uses thermal stimulus, the temperature is referred to as the annealing temperature. In some embodiments, the temperature is selected to suppress atomic diffusion/mass transport in the amorphous multicomponent ionic compound, thereby minimizing or even preventing phase decomposition/separation. This is useful for ensuring that the composition of the crystallized multicomponent ionic compound is the same as the composition of the as-deposited amorphous multicomponent ionic compound and/or that the desired crystal structure is achieved, as described above.

In some embodiments, the temperature is selected to minimize or even prevent nucleation in the amorphous multicomponent ionic compound. The term "nucleation" refers to the self-assembly of the atomic components of the amorphous multicomponent ionic compound into a larger arrangement of atoms characteristic of a crystalline phase, from which arrangement crystallization can proceed. The term refers to both homogenous nucleation (i.e., occurring within the bulk of the amorphous multicomponent ionic compound) and heterogeneous nucleation (i.e., occurring at an interface between the amorphous multicomponent ionic compound and an amorphous surface). The term is distinguished from crystallization via SPE growth from a crystalline surface. Selection of the temperature to minimize/prevent nucleation is useful for embodiments involving crystallization over a deposition substrate having both amorphous and crystalline surfaces or when the amorphous multicomponent ionic compound is otherwise in contact with a crystalline surface (e.g., via a seed/template of a crystalline material 303d as shown in FIG. 3). In such embodiments, the temperature may be selected to achieve crystallization via SPE growth from the crystalline surface without nucleation. "Without" means "substantially without" wherein "substantially" has a meaning analogous to the meaning described above. Such embodiments are based, at least in part, on the inventors' finding that the activation energy of nucleation of an amorphous material over an amorphous surface is significantly higher than the activation energy of SPE growth of the amorphous material from a crystalline surface. This finding is further described in the Example, below.

The temperature which induces crystallization via SPE growth without nucleation depends upon the selected composition of the amorphous multicomponent ionic compound, the deposition technique and conditions used to form the amorphous multicomponent ionic compound, and the amount of the as-deposited material to be crystallized via SPE growth from the crystalline surface before competing polycrystalline nucleation processes occur. The amount may be quantified as the distance as measured from the crystalline/amorphous interface (from which SPE growth proceeds) to an oppositely facing surface of the amorphous multicomponent ionic compound.

Figure 12B:
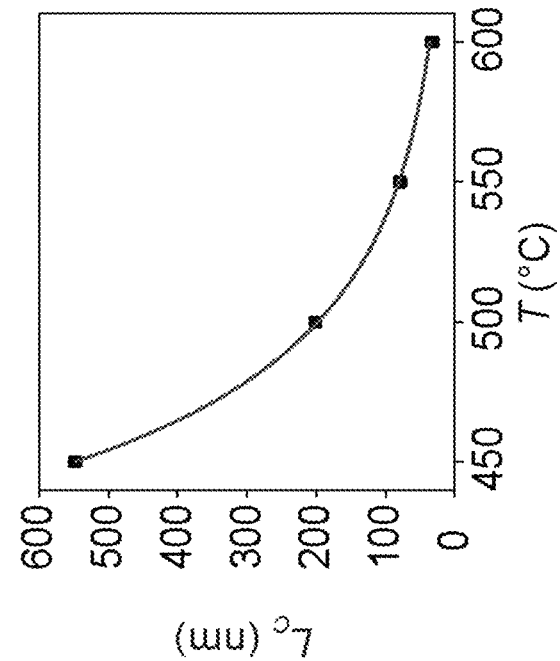
FIG. 12B shows the maximum STO film distance ($L_C$) achieved by crystallization of amorphous STO phase on a STO seed crystal, before nucleation on the $SiO_2$ mask, as a function of temperature.

For a selected composition of the amorphous multicomponent ionic compound (and deposition technique/conditions), the maximum distance that can be crystallized via SPE growth without nucleation increases as the temperature decreases. This maximum distance is also referred to as the "maximum crystallization distance before nucleation $L_C$" in the Example below. FIG. 12B shows the variation of $L_C$ for sputter-deposited $SrTiO_3$ as a function of temperature. The techniques in the Example, below, may be used to determine $L_C$ as a function of temperature for a particular composition and deposition technique/conditions. Then, the temperature can be selected based upon a given distance associated with the as-deposited amorphous multicomponent ionic compound to be crystallized.

Other considerations which may guide selection of the temperature include preventing the melting of the selected amorphous multicomponent ionic compound. Thus, the temperature may be less than the melting temperature of the selected amorphous multicomponent ionic compound. This distinguishes crystallization techniques using temperatures which are sufficiently high to liquefy/melt portions of an amorphous material, as described above. Moreover, this distinguishes crystalline techniques involving indirect amorphous-to-liquid-to-crystalline phase transformations. The temperature may be less than the melting temperature of the selected amorphous surface, which may be a relatively low melting temperature amorphous plastic as described above.

Illustrative temperatures include temperatures of about 1200° C. or less, about 1000° C. or less, about 800° C. or less, about 600° C. or less, about 550° C. or less, about 500° C. or less, about 450° C. or less, or about 400° C. or less. This includes embodiments in which the temperature is in the range of from about 400° C. to about 600° C., or from about 400° C. to about 500° C. In some embodiments, e.g., when using mechanical stimuli, the temperature may be about room temperature.

As noted above, crystallization of the amorphous multicomponent ionic compound provides the multicomponent ionic compound in a crystalline phase. The crystalline phase may be a single-crystalline phase or a polycrystalline phase. The single-crystalline phase may be achieved by using single-crystalline surfaces from which SPE growth can occur. By contrast, crystallization via nucleation results in a polycrystalline phase. The term "polycrystalline" is distinguished from a mixed amorphous-polycrystalline phase.

Compared to conventional crystallization techniques which are generally constrained to planar two-dimensional 2D structures, the dimensionality and morphology of the crystallized multicomponent ionic compounds provided by the present methods is not particularly limited. Standard thin film deposition and lithographic techniques may be used to provide deposition substrates having a variety of surface morphologies and surface regions. By way of illustration, at least some embodiments of the present methods may be used to achieve three-dimensional (3D) structures composed of crystalline multicomponent ionic compounds, including structures having intricate geometries with nanoscale dimensions (e.g., dimensions on the order of 100s or 10s of nanometers).

Figure 4A:
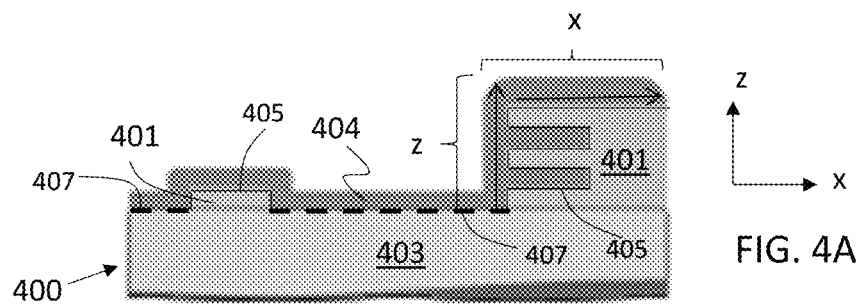
FIGS. 4A-4D show a side view of another deposition substrate providing a plurality of regions, including amorphous and crystalline surfaces.

One such embodiment is illustrated in FIGS. 4A-4D. FIG. 4A shows a side-view of a deposition substrate 400 comprising a single-crystalline material 403. Standard thin film deposition and lithographic techniques may be used to create a two-dimensional (2D) structure (left) and a 3D structure (right), each composed of an amorphous material 401, on the upper surface of the single-crystalline material 403. "2D" is used to refer to structures best characterized by two dimensions x and y, e.g., a width and length. (See the axis in FIG. 4A, where they axis is perpendicular to the plane of the page.) 2D structures may have a third dimension z (e.g., height), but generally z<<x, y. The other two dimensions x, y may be of similar magnitude. "3D" is used to refer to non-planar structures best characterized by three dimensions x, y and z, each which may be of similar magnitude. In both cases, these dimensions may refer to the overall dimensions of the structure since both 2D structures and 3D structures may include lower dimensional features within the structures. By way of illustration, the 3D structure of FIG. 4A includes lower dimensional, e.g., one-dimensional channels or 2D shelves. Thus, the upper surface of the deposition substrate 400 of FIG. 4A is non-planar and three-dimensional defining a plurality of regions including both amorphous surfaces and single-crystalline surfaces. A deposition substrate having one or more 3D structures thereon may be referred to as a 3D deposition substrate.

Figure 4B:
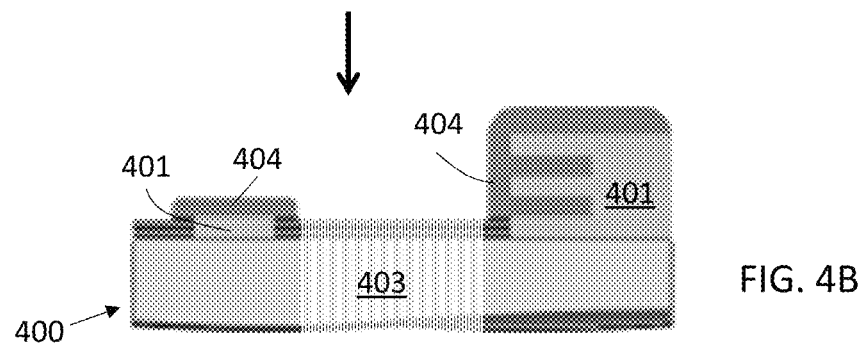
Figure 4C:
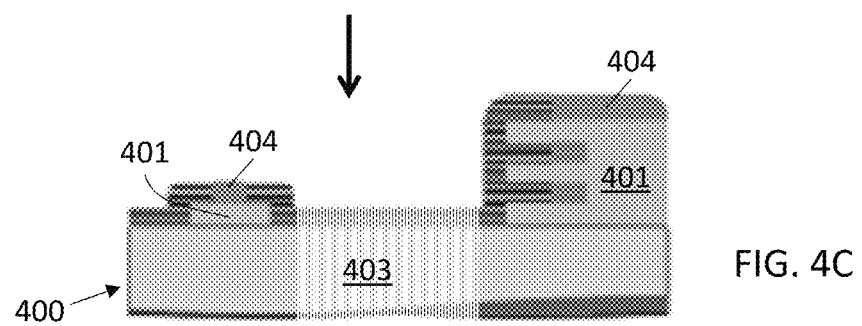

Next, as illustrated in FIG. 4A, a low-temperature deposition technique such as ALD may be used to coat the deposition substrate 400 having the plurality of regions with an amorphous multicomponent ionic compound 404. The as-deposited amorphous multicomponent ionic compound 404 contacts the amorphous material 401 of the deposition substrate 400 at a first interface 405 which is indicated with a solid black line. The as-deposited amorphous multicomponent ionic compound 404 also contacts the single-crystalline material 403 of the deposition substrate 400 at a second interface 407 which is indicated with a dotted black line. As described above, ALD is useful to provide a conformal coating even in the channels/shelves of the 3D structure. FIGS. 4B and 4C illustrate the process of heating the as-deposited amorphous multicomponent ionic compound 404 to a temperature sufficient to achieve crystallization via SPE growth from the crystalline surfaces of the deposition substrate 400 without nucleation within the amorphous multicomponent ionic compound 404. The SPE growth is illustrated with hatching.

Figure 4D:
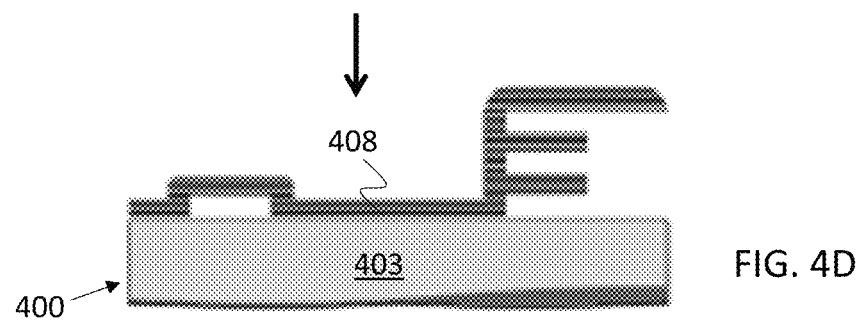

The largest distance d of the amorphous multicomponent ionic compound 404 to be crystallized via SPE growth (see FIG. 4A) may be used to select the appropriate temperature as described above. This largest distance may effectively be a SPE crystallization pathway which proceeds from an amorphous-crystalline interface along more than one direction. By way of illustration, in the embodiment of FIG. 4A, the longest SPE crystallization pathway is labeled with arrows. Thus, the largest distance d is z+x and the temperature may be selected such that $L_C \geq z+x$. Finally, as shown in FIG. 4D, selective etching may be used to remove the amorphous 2D and 3D structures, thereby resulting in a single-crystalline multicomponent ionic compound 408 having a complex, 3D geometry.

FIG. 3 also illustrates that standard transfer techniques may be used in the present methods to transfer the crystalline material 303b-c to desired locations on the deposition substrate 300 or on the upper surface of the amorphous multicomponent material 304, further increasing the scope of possible dimensionalities and morphologies for the resulting crystalline multicomponent ionic compounds. By way of illustration, single crystals having a variety of sizes (e.g., micron-to-millimeter sizes) can be lifted from the substrate on which they are crystallized by using polydimethylsiloxane (PDMS) or polymethylmethacrylate (PMMA) layers as stamps.[20,21] Another illustrative transfer process involves suspending an oxide single crystal at the surface of water or of an aqueous solution and then transferring it to a new substrate.[22] Both techniques allow the single crystals to be transferred to the amorphous substrate of interest in order to establish intricate patterns or to serve as seed crystals.

The present methods may also be used to provide heterostructures comprising interfaces between different crystalline multicomponent ionic compounds. By way of illustration, a bilayer comprising a first layer of a first amorphous multicomponent ionic compound and a second layer of a second amorphous multicomponent ionic compound on the first layer may be deposited and subsequently crystallized as described above. More than two layers of different amorphous multicomponent ionic compounds may be used to provide multilayer heterostructures. The appropriate layered structures can be created by depositing the layers of amorphous multicomponent ionic compounds sequentially using the deposition procedures previously described. There are several potential applications of interfaces created by the crystallization of multicomponent ionic materials. The composition of the first and second multicomponent ionic compounds may be selected to support a 2DEG or 2DHG at the resulting interface under the application of an electric field. Additionally, the multilayer heterostructure can incorporate ferroelectric and dielectric components such as $PbTiO_3$ and $SrTiO_3$, respectively, and can be crystallized to form superlattices or multilayers with ferroelectric functionality. The interfaces of the multilayer heterostructure can be constructed to have structural features promoting ferroelectricity due to interface rotations of oxygen octahedra.[23] Lithographic patterning techniques, including photolithography, electron-beam lithography, focused ion-beam lithography, or nanoimprint lithography may be employed to pattern the layers of the multicomponent ionic compounds either before (in the amorphous form) or after crystallization, which may be useful to provide lower dimensional structures such as one-dimensional (1D) wires and zero-dimensional (0D) dots.

Transfer techniques such as those described above may also be used in the present methods to release and transfer layers of the multicomponent ionic compounds either before (in the amorphous form) or after crystallization. The substrates to which the layers of the multicomponent ionic compounds are transferred may be referred to as transfer substrates. A variety of transfer substrates may be used, depending upon the desired application. Transfer substrates include a variety of semiconductors such as silicon. This is useful for integrating the electronic, ferroelectric, magnetic, or multiferroic, functionalities of the crystalline multicomponent ionic compounds into complementary metal oxide semiconductor (CMOS) circuitry. Transfer techniques may also be used to form multilayer structures of different crystalline multicomponent ionic compounds, i.e., multiple individual layers of amorphous multicomponent compounds may be crystallized as described above and then released and stacked to form a multilayer structure.

In addition to those described above, the crystalline multicomponent ionic compounds provided by the present methods find use in a variety of other applications, e.g., transparent multicomponent oxides for use in optoelectronic devices and piezoelectric multicomponent oxides for use in acoustic and strain transduction. Crystalline multicomponent ionic compounds may also be used as epitaxial growth substrates for other materials, including challenging materials such as GaN, ZnO alloys, $BaSnO_3$, as well as other semiconductors and electronic materials.

The present disclosure also encompasses the crystalline multicomponent ionic structures formed using the present methods, including the crystalline multicomponent ionic structures configured as intricate, 3D structures. Devices including the crystalline multicomponent ionic structures are also encompassed.

EXAMPLE

Introduction

This Example reports the relative rates of nucleation and growth in the crystallization of $SrTiO_3$ (STO). STO serves as a model for perovskite systems of interest and has experimental advantages arising from its simple-cubic symmetry and lack of competing structural phases of the same stoichiometry. The growth kinetics of STO are applicable to the formation of structurally similar crystalline oxides on various substrates and geometries. In addition, STO itself has a range of functionalities, including as a high-k gate insulator in field effect transistors,[9] a nanoscale ferroelectric,[10] and through formation of 2DEGs at LaAlO$_3$/SrTiO$_3$ (LAO/STO) interfaces.[8] The crucial insight that arises from comparing the rates of nucleation and growth is that there is a difference in the kinetics of crystallization of amorphous STO thin films on two substrates: single-crystal (001) STO and SiO$_2$/(001) Si. This Example provides a thorough study of the kinetics of crystallization of amorphous STO and enables synthesizing single-crystal STO in complex geometries.

Figure 5A:
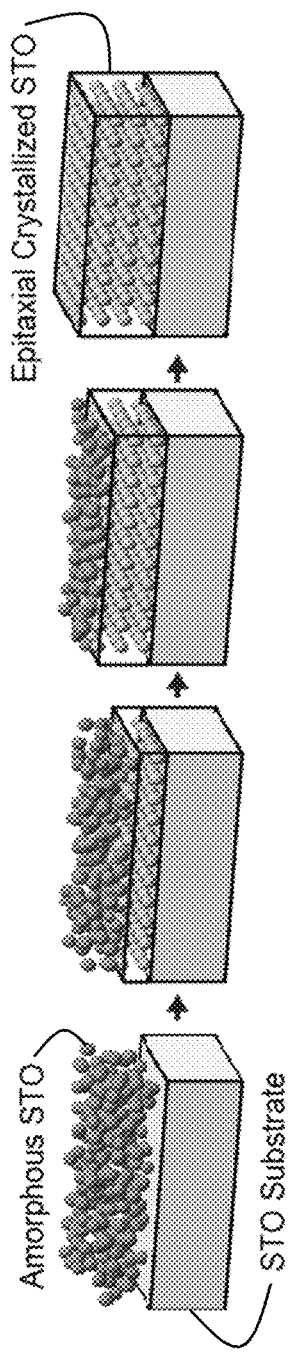
FIGS. 5A-5B shows schematic diagrams of the structural changes in the annealing process for (FIG. 5A) $SrTiO_3$ (STO) on (001) STO substrates by SPE and (FIG. 5B) STO on $SiO_2$/(001) Si substrates by nucleation and growth.
Figure 5B:
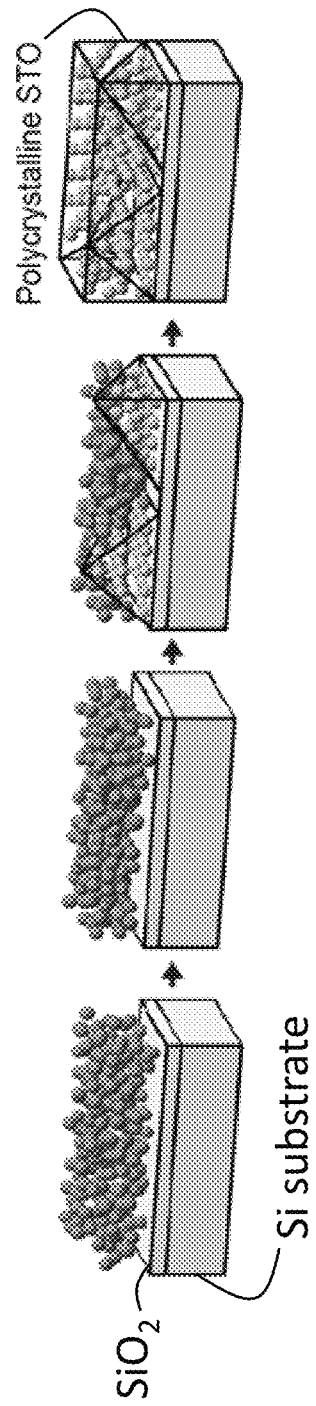

The nucleation and growth of crystalline STO from initially amorphous layers were investigated using a two-step experimental procedure: (i) sputter deposition of amorphous STO thin films on room temperature substrates and (ii) crystallization via post-deposition ex-situ annealing. The amorphous-to-crystalline transformation is dramatically different on the two substrates, as shown schematically in FIGS. 5A and 5B. As shown in FIG. 5A, on the STO substrate the initially amorphous layer crystallizes via SPE as an epitaxial thin film. As shown in FIG. 5B, the SiO$_2$/(001) Si substrates do not provide a well-defined epitaxial relationship and thus the eventual crystallization of amorphous STO layers deposited on SiO$_2$ produces a nanocrystalline STO.

The crystallization of STO on (001) STO substrates occurs through SPE via the motion of the amorphous/crystalline interface towards the surface.[11] The kinetics of SPE in STO have been studied in amorphous layers created by ion implantation,[11-12] sputter deposition,[13] and pulsed-laser deposition.[14] In addition to STO, crystallization by SPE has also been demonstrated in other complex oxides, for example in the perovskites EuTiO$_3$,[15]CaTiO$_3$,[11] and BiFeO$_3$ on STO.[16-17] SPE in homoepitaxial STO is similar to the widely employed methods in the crystallization of elemental semiconductors and SiGe semiconductor alloys.[18] The interface velocity observed in the crystallization of STO by SPE depends on sample preparation, with higher velocities observed in amorphous layers prepared by ion implantation than in layers prepared by sputter deposition.[11,13] The growth velocity also depends on impurities and can be increased significantly by increasing the H concentration within the oxide layer by crystallization in an atmosphere with a high H$_2$O partial pressure.[12,19]

The crystallization of amorphous STO films deposited on SiO$_2$/(001) Si, in contrast with SPE, occurs through crystal nucleation far from the interface. Nucleation involves a set of atomic-scale processes associated with the rearrangement of the nanometer scale structure into local metal-oxygen coordinations favorable for crystal formation.[20] These processes differ from the crystal-interface-dependent atomic processes of growth and thus nucleation has a distinct activation energy.

This Example finds that there is a regime of temperatures in which the nucleation of crystalline STO from amorphous STO is exceedingly slow compared to growth proceeding from a STO crystal substrate. The temperature dependence of nucleation and growth processes for amorphous STO shows that the nucleation of STO on SiO$_2$/Si occurs with a higher activation energy than for the velocity of the crystal/amorphous STO interface. The low-temperature range is important because it is at the low temperatures where the rates of crystal growth for STO on STO and nucleation for STO on SiO$_2$/Si are significantly different. The appropriate control of nucleation rates, coupled with amorphous STO deposition, is the key in creating single-crystal films in unconventional geometries.

Methods

STO substrates were purchased from Shinkosha Co., Ltd, with one side polished. In order to prepare TiO$_2$ terminated substrates before growth, STO crystals were prepared with annealing and deionized (DI) water treatment.[26-27] The substrate preparation was a three-step process that consisted of annealing at 1000° C. for 1 h, sonicating the substrates in DI water to dissolve superficial strontium oxide that resulted from the first anneal, and annealing for a second time at 1000° C. for 1 h. The STO substrates were then sonicated with acetone, isopropyl alcohol (IPA), methanol and DI water, with 2 minutes in each solvent. Unlike the STO substrates, the SiO$_2$/(001)Si substrates were not subjected to additional processing steps prior to cleaning.

Prior to depositing the amorphous STO films, the chamber was evacuated to 2×10−6 Torr. STO layers were grown with the substrate at room temperature at a total pressure of 18 mTorr with an Ar:O$_2$ flow-rate ratio of 6:1.

High-resolution TEM imaging was conducted using a Tecnai TF-30 transmission electron microscope operated at 300 keV. The high-resolution images for STO grown on SiO$_2$/(001)Si substrate were obtained for the Si (110) cross-sectional plane, while images for STO on (001) STO substrate were obtained for the STO (100) cross-sectional plane.

Grazing incidence x-ray diffraction was carried out to characterize the crystalline nature of the thin films, using a Bruker D8 Advance diffractometer with Cu Kα radiation at a wavelength of 1.54 Å, at a tube voltage 50 kV and current 1 mA. The scattered intensity was recorded using a two-dimensional x-ray detector. The incidence angle of the x-ray beam was determined by the beam width and sample size, to optimize the amorphous peak signal by maximizing the footprint of x-ray on samples. The incident angles for STO on STO and STO on SiO$_2$/Si were 3.2° and 1.4°, respectively. The detector angles of all measurements were fixed at 30°. XRR data were collected using a Panalytical X'Pert MRD with monochromatic Cu Kα1 x-ray radiation with a wavelength of 1.5406 Å.

Results

Amorphous STO films were deposited by on-axis RF magnetron sputter deposition onto substrates held at room temperature. Films were deposited at a growth rate of 15 nm h$^{-1}$ with total thicknesses of approximately 60 nm. The thickness of each as-deposited film thicknesses was measured using XRR. The as-deposited STO layers on both STO and SiO$_2$/Si substrates exhibited grazing incidence x-ray scattering patterns consistent with an amorphous thin film. FIGS. 6A and 6B show x-ray scattering patterns of amorphous STO films deposited under the same conditions on STO and SiO$_2$/Si substrates, respectively. A slight difference in the intensities of the scattering patterns in FIGS. 6A and 6B arises from the different incident angle of x-ray beam chosen for measurements of STO on STO(3.2°) and STO on SiO$_2$/Si (1.4°).

Figures 7A, 7B:
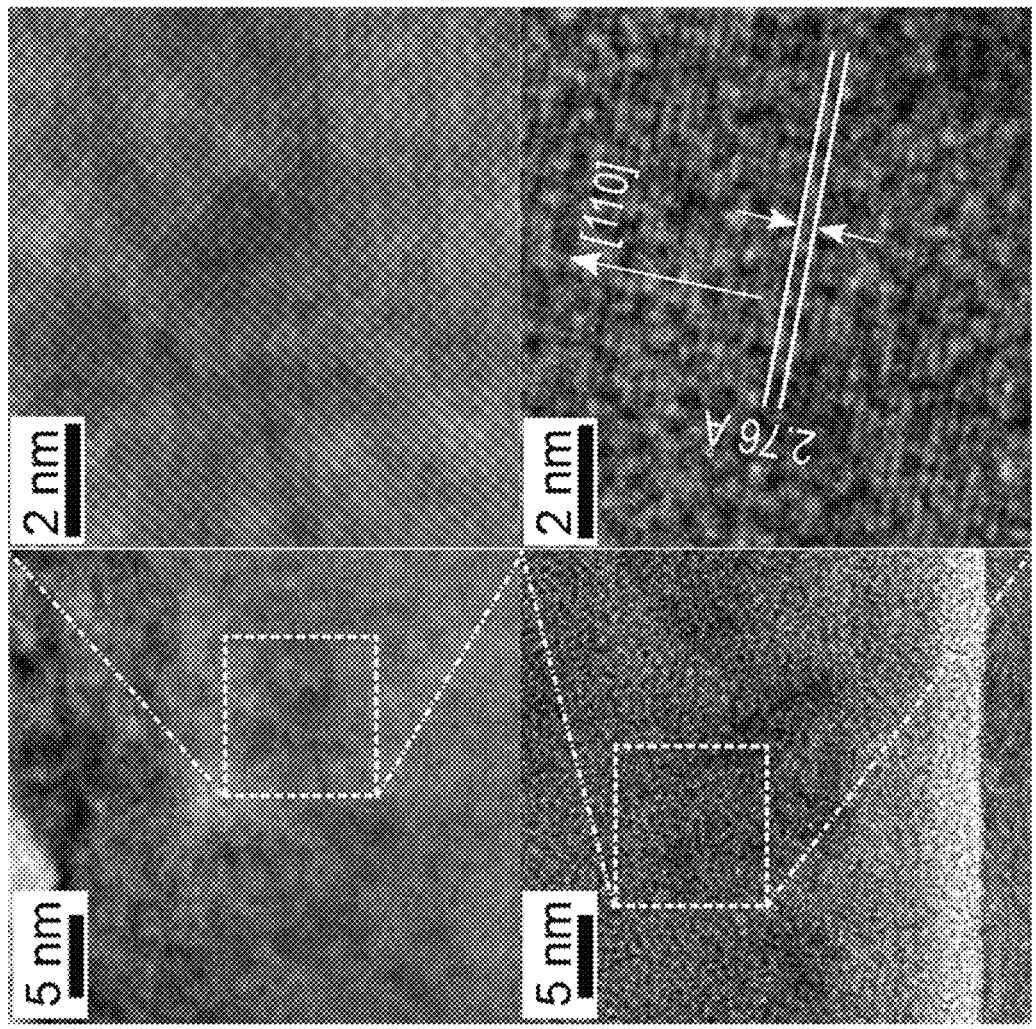
FIG. 7A shows high-resolution TEM micrographs of fully crystallized STO films on (001) STO substrates.
FIG. 7B shows high-resolution TEM micrographs of fully crystallized STO films on $SiO_2$/(001) Si substrates.

For STO on the (001) STO substrate, heating the sample induced a crystallization process in which the amorphous scattering signal disappeared without the appearance of polycrystalline diffraction rings. FIG. 6C shows the x-ray scattering pattern of an STO film with an as-deposited thickness of 61 nm after annealing at 650° C. for 5 min. TEM provides further evidence of the crystallization of STO on STO by SPE. Annealing an as-deposited amorphous film at 600° C. for 32 min results in a single-crystal epitaxial STO layer, as shown by the TEM image in FIG. 7A. The image was obtained for the STO (100) cross-sectional plane. The orientation of the lattice fringes in FIG. 7A is consistent throughout the entire structure and identical to the substrate, as seen on the magnified section in the right panel of FIG. 7A. These observations are consistent with the expectation that the crystallization of STO on STO occurs via SPE.

For STO on SiO$_2$/(001) Si, heating transforms the amorphous layer into a nanocrystalline microstructure. FIG. 6D shows the x-ray scattering pattern of a crystallized STO thin film after annealing at 650° C. for 18 min, exhibiting a series of powder diffraction rings arising from (100), (110) and (111) reflections of STO. The integrated intensity of (100) and (111) peaks are 3.3% and 19.8% of the intensity of the (110) peak, respectively. The peak positions and ratios of peak intensities agree with the powder x-ray diffraction pattern of STO[21] further confirming that polycrystals of STO form on SiO$_2$/(001) Si in random orientations. The crystal size determined from the angular widths of the (100), (110) and (111) reflections is 11 nm, 7 nm and 6 nm, respectively, based on Scherrer's formula. The size of the STO crystals is much smaller than the film thickness, indicating that STO crystal nucleation occurs within the bulk of the film and is not limited to the free surface or the STO/SiO$_2$ interface.

The crystallized STO layer and SiO$_2$/(001) Si substrate are shown in the TEM image in FIG. 7B for an STO layer with an initial thickness of 61 nm heated to 600° C. for 36 min. The image was obtained for the Si (110) cross-sectional plane. A high-resolution image of one of the nanocrystals within the layer exhibits lattice fringes with a misorientation of 11° with respect to the Si substrate. Other domains containing (110) crystal planes, with different angular orientations with respect to Si, were also observed in the HRTEM analysis. The spacing of the lattice planes in the polycrystalline domain shown in FIG. 7B is 2.76 Å, corresponding to the STO (110) plane. An interfacial oxide is also apparent in FIG. 7B. The growth of amorphous STO on SiO$_2$/(001)Si has been shown to facilitate an initial thickening of the interfacial SiO$_2$ layer due to oxidation of the silicon substrate.[14]

The dependence of the scattered x-ray intensity for an amorphous STO layer on (001) STO for a series of crystallization times at 600° C. was obtained. Data was acquired in a series of separate heating steps, each of which was followed by x-ray scattering characterization. The intensity of scattering from the amorphous layer gradually decreases with increasing annealing time. The integrated amorphous phase scattered x-ray intensity is shown as a function of heating time for a wide range of annealing temperatures in FIG. 8A. The details of the determination of the amorphous phase scattered x-ray intensity from 2D detector images is given in the Methods section. The intensity in the angular range of scattering from the amorphous layer is slightly higher than the background even following long annealing times, an effect that is accounted for in the analysis below. It is hypothesized that this small difference, which is on the order of 10-30% of the total intensity of the scattering from the amorphous layer, may arise from small differences in the run-to-run alignment of the sample on the x-ray diffractometer, the formation of very small crystallites, or scattering from surface contamination accumulated during processing.

The growth velocity for crystallization of STO on (001) STO via SPE was determined from the rate of decrease of the scattered x-ray intensity from the amorphous layer. The amorphous phase scattered x-ray intensity, I, can be modeled as I=C x(t)+ΔI. Here, C is a constant dependent on the incident x-ray intensity, the scattering per unit volume from the amorphous layer, and detector parameters, x(t) is the thickness of the amorphous layer at time t, and ΔI is the non-zero scattered x-ray intensity of the fully crystallized film. The velocity is $$v = \frac{dx}{dt} = \frac{1}{C}\frac{dI}{dt}.$$

The constant C can be obtained by comparing the initial state and final states, $$C = \frac{I_0 - \Delta I}{x_0},$$

where $x_0$ is the initial thickness of the amorphous STO film and $I_0$ is the initial scattered intensity of the as-deposited film. The growth velocity, v, is then given by:

$$v = \frac{dI}{dt}\frac{x_0}{I_0 - \Delta I} \quad (1)$$

Figure 8A:
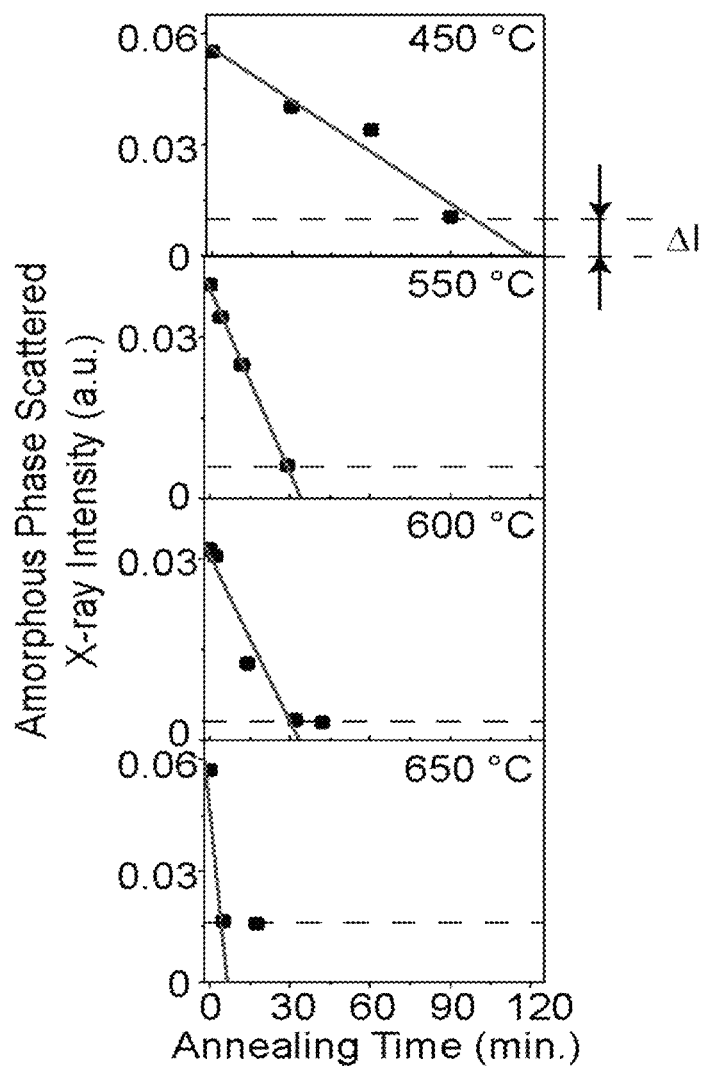
FIG. 8A shows the amorphous phase X-ray scattered intensity as a function of annealing time for STO layers annealed at temperatures of 450° C., 550° C., 600° C. and 650° C.
Figure 8B:
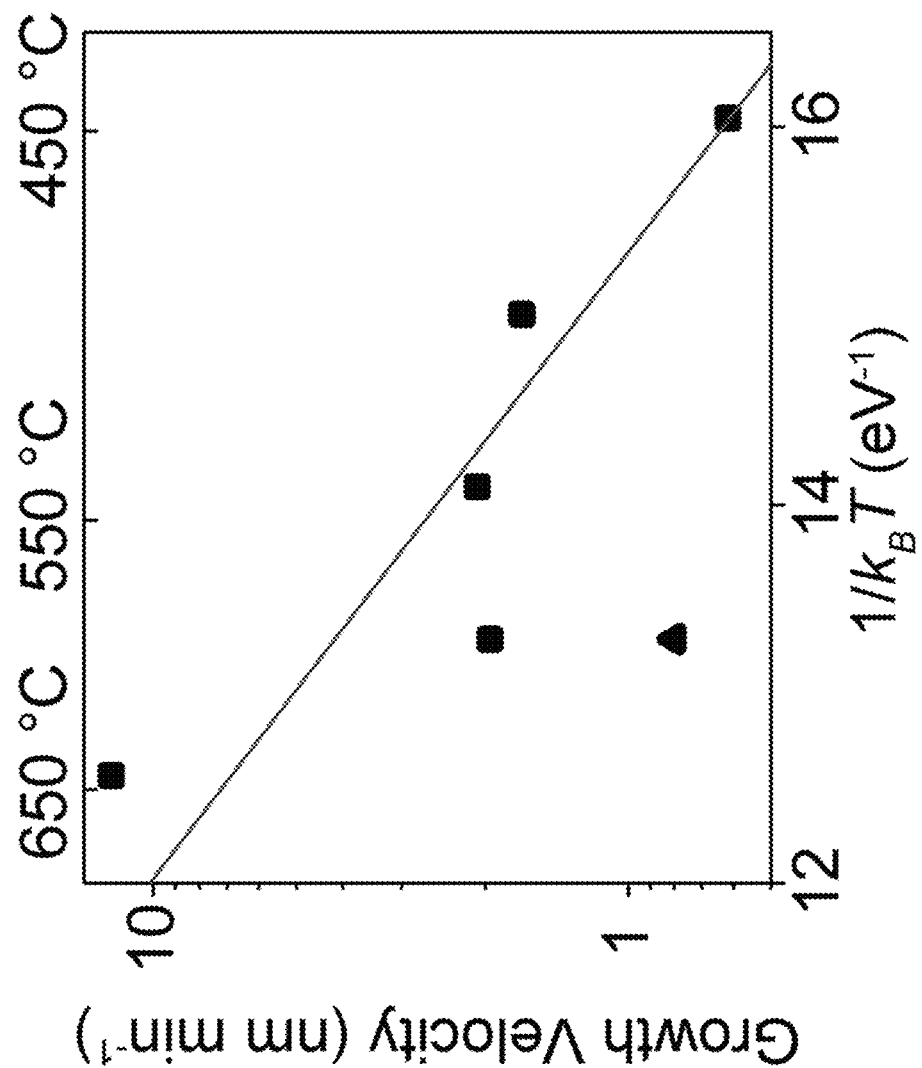
FIG. 8B shows growth velocities measured using the data shown in FIG. 8A (squares), and growth velocity at 600° C. determined using XRR (triangle).

The growth velocities found by applying equation (1) to the x-ray data are plotted as a function of temperature in FIG. 8B. The velocities range from 0.6 nm min$^{-1}$ at 450° C. to 12.3 nm min$^{-1}$ at 650° C. The measured velocity of 2 nm s$^{-1}$ at 500° C. is similar to the value of 4 nm s$^{-1}$ that can be inferred from a previous report of the time required to crystallize a sputter-deposited STO film at the same temperature.[13]

Previous studies of SPE of STO, as well as in Si, SiGe and other semiconductors have found that the growth velocity is described by an Arrhenius temperature dependence given by $v(T)=v_0 e^{-E_a/k_B T}$. Here $E_\alpha$ is the effective activation energy for the processes determining the velocity, $v_0$ is a prefactor with units of velocity, $k_B$ is the Boltzmann constant, and T is the temperature. A fit of this expression to the growth velocities reported in FIG. 8B for the temperature range from 450° C. to 650° C. gives an activation energy of 0.7 eV.

Reported activation energies for the growth front velocity for crystallization of STO on STO substrates varies significantly depending on the gas ambient during annealing.[12,19] The activation energy obtained in this Example is in reasonable agreement with the value of 0.77 eV reported for ion-implanted amorphous STO by SPE in the (100) direction.[11] Other reported activation energies range from 1.2 eV in an H$_2$O atmosphere to more than 3 eV in vacuum.[12] The impact of this range of activation energies on the finding of the temperature dependence of the relative rates of nucleation and growth is discussed in more detail below.

Figure 9:
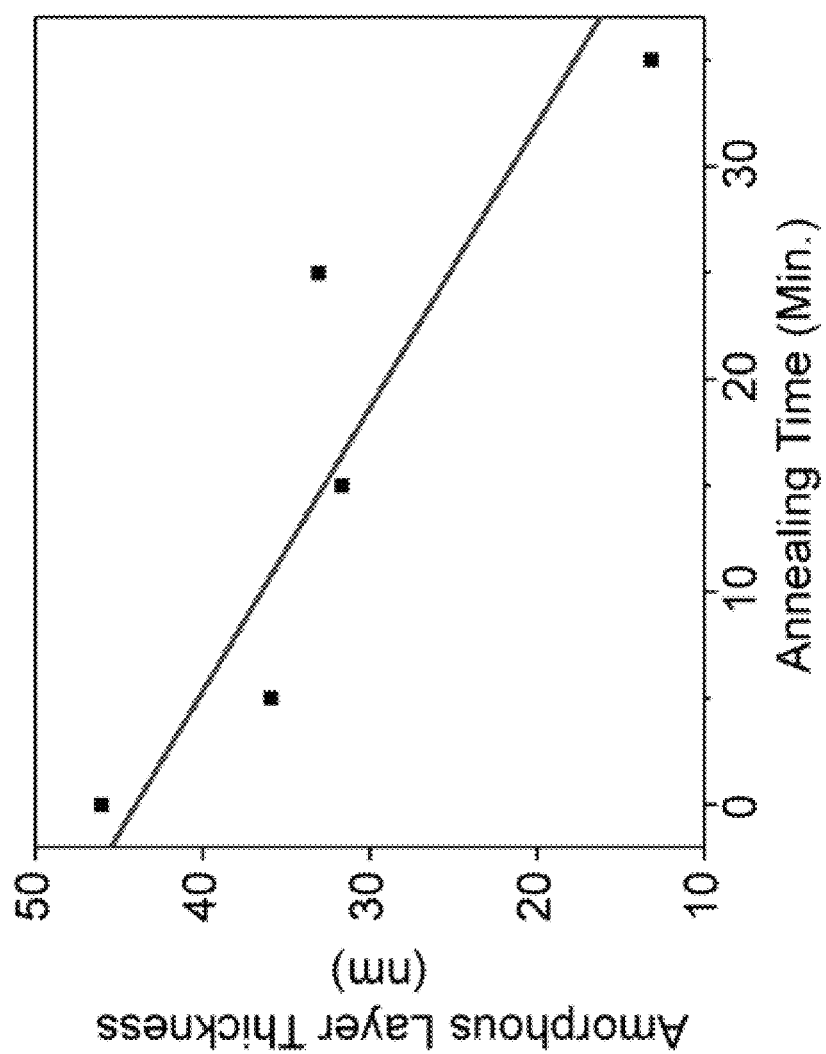
FIG. 9 shows amorphous STO layer thickness, derived from the fringe spacing in XRR data, as a function of annealing time at 600° C.

XRR provides further support for the crystallization of STO on (001) STO by the motion of a planar crystal/amorphous interface by SPE. XRR curves for an amorphous STO layer on a STO substrate were obtained for a series of annealing times at 600° C. Amorphous layer thicknesses determined from the average fringe spacing decrease continuously as a function of time, as shown in FIG. 9. The velocity determined from FIG. 9 is 1.1 nm/min, slightly less than the growth velocity at 600° C., obtained from the intensity of the x-ray scattering data on a different sample as shown in FIG. 8A is 1.9 nm/min.

The crystallization of STO on SiO$_2$/(001) Si occurs by a polycrystalline nucleation and growth process. The time dependence of the intensity of x-ray scattering from amorphous STO layers on SiO$_2$/Si at an annealing temperature of 600° C. was examined. After annealing for 16 min, polycrystalline STO peaks start to appear, marking the point when a large number of nuclei have formed. This nucleation time depends on the temperature of the crystallization process. Without seed crystals or templates on the substrate, nuclei form in random orientations, resulting in polycrystalline film. An initial increase in scattered amorphous intensity for annealing between 450 and 600° C. occurs before the appearance of crystalline x-ray reflections and could in principle arise from a rearrangement within the amorphous structure.

Figure 10:
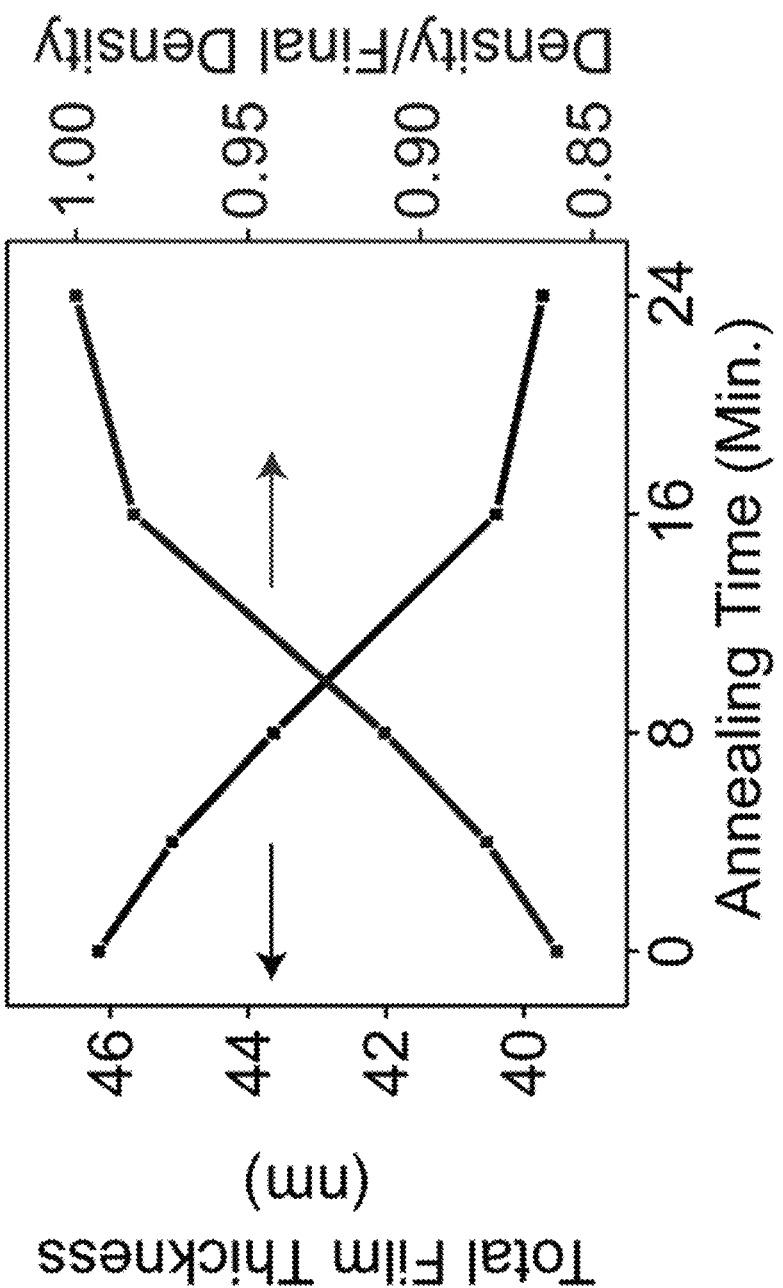
FIG. 10 shows the relationship between film thickness and density as a function of annealing time at 600° C.
Figure 11A:
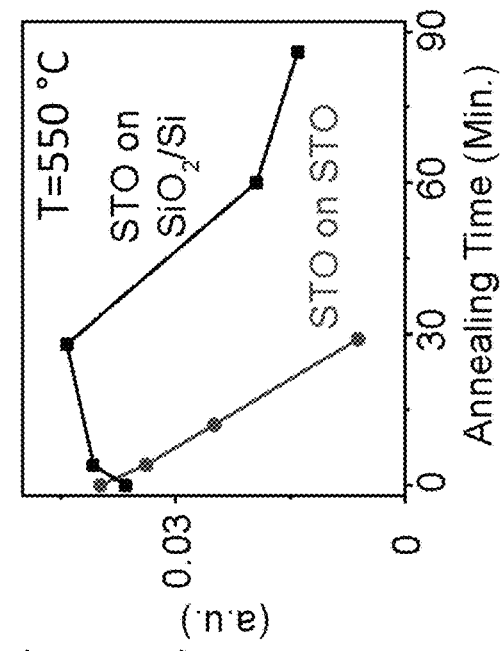
FIGS. 11A-11D show a comparison between amorphous phase scattered x-ray intensity between STO on $SiO_2/(001)$ Si substrate and STO on (001) STO substrate, as a function of annealing time, at different annealing temperatures. The nucleation delay for STO on $SiO_2$ becomes obvious at relatively lower annealing temperatures.
Figure 11B:
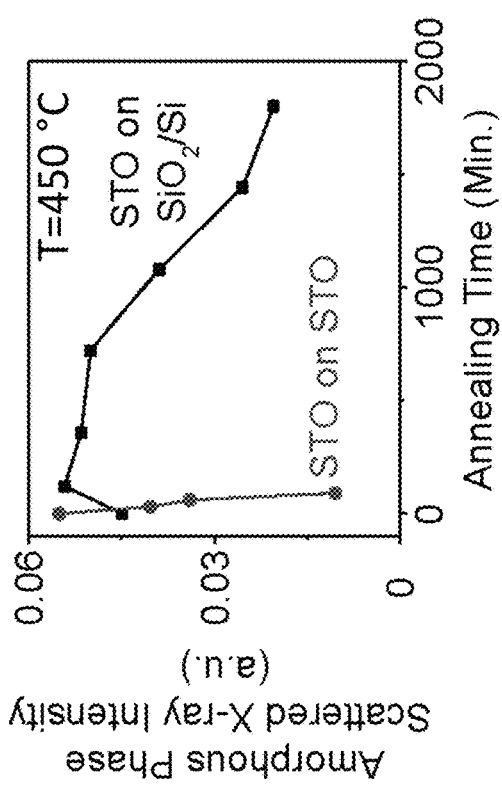
Figure 11C:
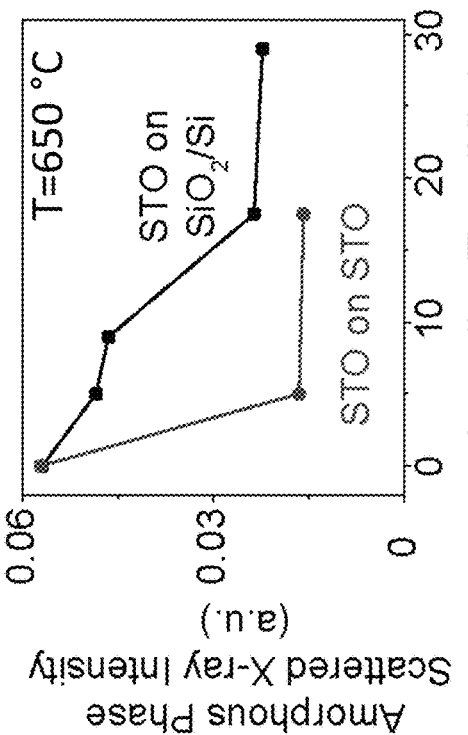
Figure 11D:
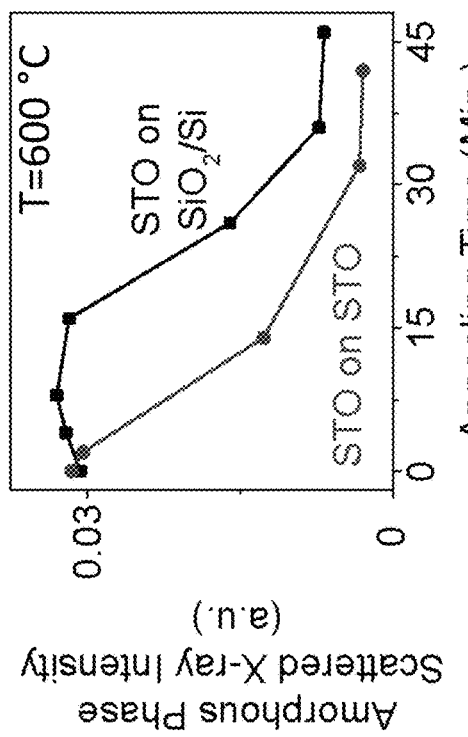

XRR curves for an STO layer deposited on $SiO_2/(001)$ Si and annealed at 600° C. for different time periods were obtained. For STO on $SiO_2/(001)$ Si the fringe spacing provides information about the total STO film thickness because the density difference between STO and $SiO_2$ is much larger than the density difference between crystalline STO and amorphous STO. The total film thickness decreases slightly upon crystallization, from 46 nm to 40 nm, as shown in FIG. 10. FIG. 10 also shows the ratio of the density to the final density as a function of annealing time, based on the assumption that the total mass does not change. The as-deposited density of amorphous STO phase is 87% of the density of final crystalline STO, consistent with reported densities of 4.2±0.1 g cm$^{-3}$ and 5.1 g cm$^{-3}$ for amorphous and crystalline STO, respectively.[12, 22-23] The XRR results thus indicate that a density change of on the order of 13% can be expected during the crystallization of amorphous STO.

FIGS. 11A-11D summarize the crystallization dynamics of STO for the two different substrates by comparing the time-evolution of the intensity of scattering from the amorphous STO layer. Two effects are apparent in these figures. First, the crystallization of amorphous STO on STO occurs in a much shorter time than that on $SiO_2$. Second, role of nucleation in the crystallization of STO on $SiO_2$/Si can be quantified by considering the nucleation time t*, which is defined to be the longest time at which amorphous phase scattered x-ray intensity is equal to its as-deposited value. The nucleation time, t*, for STO on $SiO_2$ is longer than the crystallization time of STO on STO at lower annealing temperatures. For instance, at 450° C., t* is 14 h whereas the crystallization of STO on STO (001) is completed in less than 1 h. The nucleation time at 650° C. is less than the minimum annealing time, and thus was not measured.

Assuming that the nucleation process is also thermally activated, the nucleation time t* for STO on $SiO_2$/Si can be expressed using an Arrhenius temperature dependence:

$$\frac{1}{t^*} = \frac{1}{t_0^*} e^{-E_b/k_B T}.$$

Figure 12A:
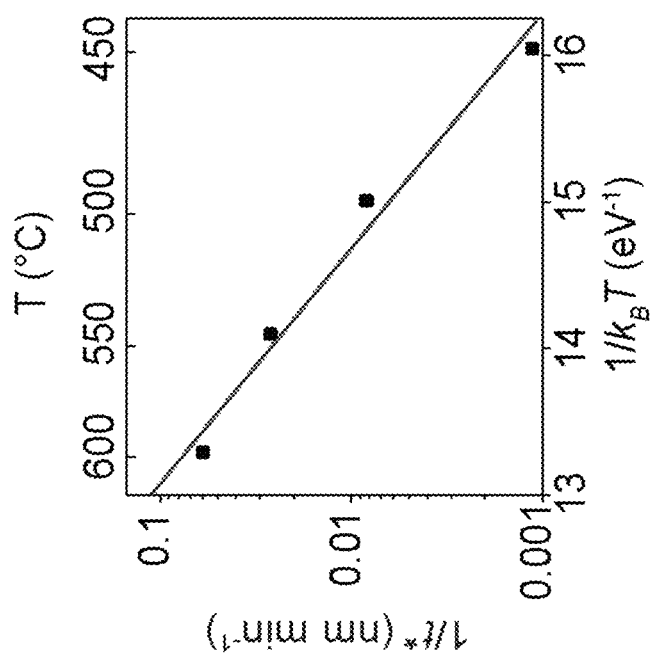
FIG. 12A shows the thermally activated nucleation kinetics of STO on $SiO_2/(001)$ Si substrates as a function of annealing temperature.

Here $1/t_0^*$ is a temperature-independent constant and $E_b$ is the activation energy for nucleation. The variation of t* with temperature is plotted in FIG. 12A. The nucleation activation energy obtained by fitting the experimentally observed nucleation time with this temperature dependence is 1.4 eV. The difference between the activation energies for crystal growth and nucleation is a key effect that enables finding a window in which growth proceeds without significant nucleation.

Discussion

This relatively long nucleation time for STO on $SiO_2$ provides the insight required to form STO and other complex oxides in sophisticated geometries. In such cases, crystalline STO can act as a crystalline template and materials with other compositions, such as $SiO_2$, serve as a mask. As is apparent from the long nucleation times in FIGS. 11A-11D, the $SiO_2$ mask can geometrically direct the crystallization path without providing sites for crystallization. The key parameter for the process of guiding the path of crystallization using a mask is the maximum film thickness or distance over which the amorphous STO can crystallize before the nucleation of crystalline STO occurs away from the moving interface.

The SPE crystallization velocities and polycrystal nucleation time can be used to deduce the maximum crystallization distance before nucleation, $L_C$. $L_C$ can be expressed as $L_C = vt^*$, where v is the SPE crystallization velocity on STO and t* is the nucleation time on $SiO_2$. The values of $L_C$ at annealing temperatures in the range of this Example are plotted in FIG. 12B. The distance covered before nucleation increases as the temperature decreases. The largest distance is achieved at the relatively low temperature of 450° C. FIG. 12B indicates that for temperatures above 600° C. the crystallization lengths that can be achieved are less than 50 nm, lower than the thickness of as-deposited amorphous layers. Crystallizing amorphous films by SPE at temperatures above 600° C. thus raises the possibility of creating highly defective films due to nucleation away from the crystal-amorphous interface.

$L_C$ is a function of v and t*, which were assumed to be both thermally activated. Therefore, $L_C$ can be expressed as:

$$L_C = vt^* = v_0 t_0^* e^{-\frac{E_a - E_b}{k_B T}} = v_0 t_0^* e^{-\frac{\Delta E}{k_B T}} \quad (2)$$

By fitting the data in FIG. 12B with Eq. (2), using W and ΔE as fitting parameters, the maximum film thicknesses at different annealing temperatures can be estimated.

The increase in the crystallization distances at low temperatures apparent in FIG. 12B shows that flash heating, or other rapid thermal processing techniques at high temperatures, are not appropriate for suppressing nucleation to create thick single-crystalline layers of STO. A similar consideration is important in the crystallization of STO within high aspect ratio structures, e.g., narrow and deep trenches or pores. Very large distances of the progression of crystalline interfaces are obtained at low temperatures, e.g., 500 nm at 450° C. Equation (2) further suggests that $L_C$ can be increased by further optimizing the difference between the activation energies for nucleation and interface motion, for example by varying the gaseous environment around the sample during heating.

The observation that STO can be crystallized even in the presence of potential mask materials points to methods through which similar functional oxides, e.g., ferroelectric $PbTiO_3$ and $BaTiO_3$, can be grown in complex geometries. In addition, other complex oxide electronic interfaces can be created by recrystallization, facilitating the integration of complex oxides in 3D electronic and optoelectronic devices. Low-energy ion bombardment and annealing of an LAO/STO 2DEG formed at the interface between a 4 nm-LAO thin film and STO substrate lead to the disappearance and recovery of the 2DEG.[25]

REFERENCES

1. J. L. MacManus-Driscoll, "*Self-Assembled Heteroepitaxial Oxide Nanocomposite Thin Film Structures: Designing Interface-Induced Functionality in Electronic Materials,*" Adv. Funct. Mater. 20, 2035-2045 (2010).
2. D. H. Kim, X. Sun, T. C. Kim, Y. J. Eun, T. Lee, S. G. Jeong, and C. A. Ross, "*Magnetic Phase Formation in Self-Assembled Epitaxial $BiFeO_3$-MgO and $BiFeO_3$—$MgAl_2O_4$ Nanocomposite Films Grown by Combinatorial Pulsed Laser Deposition,*" ACS Appl. Mater. Interf. 8, 2673-2679 (2016).
3. L. Yan, Y. D. Yang, Z. G. Wang, Z. P. Xing, J. F. Li, and D. Viehland, "*Review of magnetoelectric perovskite-spinel self-assembled nano-composite thin films,*" J. Mater. Sci. 44, 5080-5094 (2009).
4. T. S. Tighe, J. M. Worlock, and M. L. Roukes, "*Direct thermal conductance measurements on suspended monocrystalline nanostructures,*" Appl. Phys. Lett. 70, 2687-2689 (1997).
5. J. Jang, D. Moon, H. J. Lee, D. Lee, D. Choi, D. Bae, H. Yuh, Y. Moon, Y. Park, and E. Yoon, "*Incorporation of air-cavity into sapphire substrate and its effect on GaN growth and optical properties,*" J. Cryst. Growth 430, 41-45 (2015).
6. N. Setter, D. Damjanovic, L. Eng, G. Fox, S. Gevorgian, S. Hong, A. Kingon, H. Kohlstedt, N. Y. Park, G. B. Stephenson, I. Stolitchnov, A. K. Tagantsev, D. V. Taylor, T. Yamada, and S. Streiffer, "*Ferroelectric thin films: Review of materials, properties, and applications,*" J. Appl. Phys. 100, 051606 (2006).
7. G. L. Cheng, M. Tomczyk, S. C. Lu, J. P. Veazey, M. C. Huang, P. Irvin, S. Ryu, H. Lee, C. B. Eom, C. S. Hellberg, and J. Levy, "*Electron pairing without superconductivity,*" Nature 521, 196 (2015).
8. A. Ohtomo and H. Y. Hwang, "*A high-mobility electron gas at the $LaAlO_3/SrTiO_3$ heterointerface,*" Nature 427, 423-426 (2004).
9. J. S. Gardner, M. J. P. Gingras, and J. E. Greedan, "*Magnetic pyrochlore oxides,*" Rev. Mod. Phys. 82, 53-107 (2010).
10. T. C. Fujita, Y. Kozuka, M. Uchida, A. Tsukazaki, T. Arima, and M. Kawasaki, "*Odd-parity magnetoresistance in pyrochlore iridate thin films with broken time-reversal symmetry,*" Sci Rep 5, 9711 (2015).
11. T. C. Fujita, M. Uchida, Y. Kozuka, S. Ogawa, A. Tsukazaki, T. Arima, and M. Kawasaki, "*All-in-all-out magnetic domain size in pyrochlore iridate thin films as probed by local magnetotransport,*" Appl. Phys. Lett. 108, 022402 (2016).
12. J. C. Gallagher, B. D. Esser, R. Morrow, S. R. Dunsiger, R. E. A. Williams, P. M. Woodward, D. W. McComb, and F. Y. Yang, "*Epitaxial growth of iridate pyrochlore $Nd_2Ir_2O_7$ films,*" Sci Rep 6, 22282 (2016).
13. V. Miikkulainen, M. Leskela, M. Ritala, and R. L. Puurunen, "*Crystallinity of inorganic films grown by atomic layer deposition: Overview and general trends,*" J. Appl. Phys. 113, 021301 (2013).
14. M. R. Laskar, D. H. K. Jackson, Y. Guan, S. Xu, S. Fang, M. Dreibelbis, M. K. Mahanthappa, D. Morgan, R. J. Hamers, and T. F. Kuech, "*Atomic Layer Deposition of $Al_2O_3$—$Ga_2O_3$ Alloy Coatings for $Li[Ni_{0.5}Mn_{0.3}Co_{0.2}]O_2$ Cathode to Improve Rate Performance in Li-Ion Battery,*" ACS Appl. Mater. Interf. 8, 10572-10580 (2016).
15. M. Vehkamaki, T. Hanninen, M. Ritala, M. Leskela, T. Sajavaara, E. Rauhala, and J. Keinonen, "*Atomic layer deposition of $SrTiO_3$ thin films from a novel strontium precursor-strontium-bis(tri-isopropylcyclopentadienyl),*" Chem. Vapor Dep. 7, 75-80 (2001).
16. G. W. Hwang, H. Ju Lee, K. Lee, and C. S. Hwang, "*Atomic Layer Deposition and Electrical Properties of $PbTiO_3$ Thin Films Using Metalorganic Precursors and $H_2O$,*" J. Electrochem. Soc. 154, G69-G76 (2007).
17. F. Wang, M. Badaye, Y. Yoshida, and T. Morishita, "*Characterization of the recovery and recrystallization of $SrTiO_3$ surface by ion channeling,*" Nucl. Instrum. Meth. B 118, 547-551 (1996).
18. D. Zhu, X. Shou, Y. Liu, E. Chen, and S. Z. Cheng, "*AFM-tip-induced crystallization of poly (ethylene oxide) melt droplets,*" Front. Chem. China 2, 174-177 (2007).
19. S. Jesse, Q. He, A. R. Lupini, D. N. Leonard, M. P. Oxley, O. Ovchinnikov, R. R. Unocic, A. Tselev, M. Fuentes-Cabrera, B. G. Sumpter, S. J. Pennycook, S. V. Kalinin, and A. Y. Borisevich, "*Atomic-Level Sculpting of Crystalline Oxides: Toward Bulk Nanofabrication with Single Atomic Plane Precision,*" Small 11, 5895 (2015).
20. D. Lu, D. J. Baek, S. S. Hong, L. F. Kourkoutis, Y. Hikita, and H. Y. Hwang, "*Synthesis of freestanding single-crystal perovskite films and heterostructures by etching of sacrificial water-soluble layers,*" Nature Mater. 15, 1255-1260 (2016).
21. S. R. Bakaul, C. R. Serrao, M. Lee, C. W. Yeung, A. Sarker, S. L. Hsu, A. K. Yadav, L. Dedon, L. You, A. I. Khan, J. D. Clarkson, C. M. Hu, R. Ramesh, and S. Salahuddin, "*Single crystal functional oxides on silicon,*" Nature Commun. 7, 10547 (2016).
22. D. M. Paskiewicz, R. Sichel-Tissot, E. Karapetrova, L. Stan, and D. D. Fong, "*Single-Crystalline $SrRuO_3$ Nanomembranes: A Platform for Flexible Oxide Electronics,*" Nano Lett. 16, 534 (2016).
23. J. M. Rondinelli and C. J. Fennie, "*Octahedral Rotation-Induced Ferroelectricity in Cation Ordered Perovskites,*" Adv. Mater. 24, 1961-1968 (2012).
24. M. L. Reinle-Schmitt, C. Cancellieri, D. Li, D. Fontaine, M. Medarde, E. Pomjakushina, C. W. Schneider, S. Gariglio, P. Ghosez, J. M. Triscone, and P. R. Willmott, "*Tunable conductivity threshold at polar oxide interfaces,*" Nature Commun. 3, 932 (2012).
25. D. Lee, H. Lu, Y. Gu, S. Y. Choi, S. D. Li, S. Ryu, T. R. Paudel, K. Song, E. Mikheev, S. Lee, S. Stemmer, D. A. Tenne, S. H. Oh, E. Y. Tsymbal, X. Wu, L. Q. Chen, A. Gruverman, and C. B. Eom, "*Emergence of room-temperature ferroelectricity at reduced dimensions,*" Science 349, 1314-1317 (2015).
26. C. W. White, L. A. Boatner, P. S. Sklad, C. J. Mchargue, J. Rankin, G. C. Farlow, and M. J. Aziz, "*Ion-Implantation and Annealing of Crystalline Oxides and Ceramic Materials,*" Nucl. Instrum. Meth. B 32, 11-22 (1988).
27. T. W. Simpson, I. V. Mitchell, J. C. Mccallum, and L. A. Boatner, "*Hydrogen Catalyzed Crystallization of Strontium Titanate,*" J. Appl. Phys. 76, 2711-2718 (1994).
28. B. G. Almeida, A. Pietka, P. Caldelas, J. A. Mendes, and J. L. Ribeiro, "*Determination of infrared optical parameters of $SrTiO_3$ thin films from the reflectivity spectrum,*" Thin Solid Films 513, 275-282 (2006).
29. K. Shimamoto, Y. Hirose, S. Nakao, T. Fukumura, and T. Hasegawa, "*Solid phase epitaxy of $EuTiO_3$ thin films on $SrTiO_3$ (100) substrates with different oxygen contents,*" J. Cryst. Growth 378, 243-245 (2013).
30. A. R. Akbashev, A. V. Plokhikh, D. Barbash, S. E. Lofland, and J. E. Spanier, "*Crystallization engineering as a route to epitaxial strain control,*" APL Mater. 3, 106102 (2015).

31. A. R. Akbashev, G. N. Chen, and J. E. Spanier, "*A Facile Route for Producing Single-Crystalline Epitaxial Perovskite Oxide Thin Films*," Nano Lett. 14, 44-49 (2014).
32. O. Skibitzki, Y. Yamamoto, M. A. Schubert, and B. Tillack, "*Solid-phase epitaxy of undoped amorphous silicon by in-situ postannealing*," Thin Solid Films 520, 3271-3275 (2012).
33. J. Rankin, J. C. McCallum, and L. A. Boatner, "*The Effect of Annealing Environments on the Epitaxial Recrystallization of Ion-Beam-Amorphized $SrTiO_3$*," J. Mater. Res. 7, 717-724 (1992).
34. G. Gutierrez and B. Johansson, "*Molecular dynamics study of structural properties of amorphous $Al_2O_3$*," Phys. Rev. B 65, 104202 (2002).
35. J. G. Connell, B. J. Isaac, G. B. Ekanayake, D. R. Strachan, and S. S. A. Seo, "*Preparation of atomically flat $SrTiO_3$ surfaces using a deionized-water leaching and thermal annealing procedure*," Appl. Phys. Lett. 101, 251607 (2012).
36. J. E. Boschker and T. Tybell, "*Qualitative determination of surface roughness by in situ reflection high energy electron diffraction*," Appl. Phys. Lett. 100, 151604 (2012).
37. ICDD PDF, "PDF #01-070-6460," International Centre for Diffraction Data Powder Diffraction File, Newtown Square, Pa., USA.
38. J. Liu, Z. J. Shen, M. Nygren, B. Su, and T. W. Button, "*Spark plasma sintering behavior of nano-sized (Ba, Sr)$TiO_3$ powders: Determination of sintering parameters yielding nanostructured ceramics*," J. Am. Ceram. Soc. 89, 2689-2694 (2006).
39. S. L. Cuffini, V. A. Macagno, R. E. Carbonio, A. Melo, E. Trollund, and J. L. Gautier, "*Crystallographic, Magnetic, and Electrical-Properties of $SrTi_{1-x}Ru_xO_3$ Perovskite Solid-Solutions*," J. Solid State Chem. 105, 161-170 (1993).
40. A. T. W. Kempen, F. Sommer, and E. J. Mittemeijer, "*Determination and interpretation of isothermal and non-isothermal transformation kinetics; the effective activation energies in terms of nucleation and growth*," J. Mater. Sci. 37, 1321-1332 (2002).
41. P. P. Aurino, A. Kalabukhov, N. Tuzla, E. Olsson, A. Klein, P. Erhart, Y. A. Boikov, I. T. Serenkov, V. I. Sakharov, T. Claeson, and D. Winkler, "*Reversible metal-insulator transition of Ar-irradiated $LaAlO_3/SrTiO_3$ interfaces*," Phys. Rev. B 92, 155130 (2015).

The word "illustrative" is used herein to mean serving as an example, instance, or illustration. Any aspect or design described herein as "illustrative" is not necessarily to be construed as preferred or advantageous over other aspects or designs. Further, for the purposes of this disclosure and unless otherwise specified, "a" or "an" means "one or more".

The foregoing description of illustrative embodiments of the invention has been presented for purposes of illustration and of description. It is not intended to be exhaustive or to limit the invention to the precise form disclosed, and modifications and variations are possible in light of the above teachings or may be acquired from practice of the invention. The embodiments were chosen and described in order to explain the principles of the invention and as practical applications of the invention to enable one skilled in the art to utilize the invention in various embodiments and with various modifications as suited to the particular use contemplated. It is intended that the scope of the invention be defined by the claims appended hereto and their equivalents.

What is claimed is:

1. A method for crystallizing an amorphous multicomponent ionic compound, the method comprising:
    (a) determining a largest distance to be crystallized via solid phase epitaxy (SPE) growth without nucleation in a layer of the amorphous multicomponent ionic compound,
    wherein the layer contacts an amorphous surface of a deposition substrate at a first interface and contacts a crystalline surface of the deposition substrate at a second interface, and
    wherein the largest distance is measured from the second interface along an SPE crystallization pathway through the layer to a surface of the layer that is furthest from the second interface;
    (b) selecting a temperature for heating the layer from a calibration curve of maximum crystallization distance without nucleation $L_C$ versus temperature, such that the $L_C$ at the temperature is greater than or equal to the largest distance; and
    (c) heating the layer at the temperature to convert the layer to a layer of a crystalline multicomponent ionic compound via SPE growth without nucleation.
2. The method of claim 1, further comprising measuring $L_C$ as a function of temperature to provide the calibration curve.
3. The method of claim 2, wherein $L_C=vt^*$, wherein v is a velocity for crystallization of the layer of the amorphous multicomponent ionic compound via SPE growth from the crystalline surface and $t^*$ is a nucleation time of the layer of the amorphous multicomponent ionic compound, and wherein measuring $L_C$ as a function of temperature comprises measuring v as a function of temperature and measuring $t^*$ as a function of temperature.
4. The method of claim 1, wherein the temperature is no greater than 550° C.
5. The method of claim 1, wherein the temperature is no greater than 450° C.
6. The method of claim 1, further comprising depositing the layer of the amorphous multicomponent ionic compound on the deposition substrate.
7. The method of claim 6, wherein depositing the layer of the amorphous multicomponent ionic compound is carried out at 300° C. or less.
8. The method of claim 6, wherein depositing the layer of the amorphous multicomponent ionic compound is carried out at room temperature.
9. The method of claim 6, wherein step (c) provides a single-crystalline multicomponent ionic compound.
10. The method of claim 1, wherein the amorphous multicomponent ionic compound is an amorphous multicomponent oxide.
11. The method of claim 10, wherein the amorphous multicomponent oxide is selected from the group consisting of perovskites, spinels, pyrochlores, and ferrites.
12. The method of claim 1, wherein the amorphous surface is provided by a plastic, silica, or glass.
13. The method of claim 1, wherein the deposition substrate is non-planar and three-dimensional such that the layer of the amorphous multicomponent ionic compound is characterized by a complementary three-dimensional morphology and step (c) provides the crystalline multicomponent ionic compound also characterized by the complementary three-dimensional morphology.

14. A method for crystallizing an amorphous multicomponent ionic compound, the method comprising:
   (a) depositing a layer of an amorphous multicomponent ionic compound on a deposition substrate, wherein the layer contacts an amorphous surface of the deposition substrate at a first interface and contacts a crystalline surface of the deposition substrate at a second interface;
   (b) selecting a temperature for heating the layer from a calibration curve of maximum crystallization distance without nucleation $L_C$ versus temperature; and
   (c) heating the layer at the temperature to convert the layer to a layer of a crystalline multicomponent ionic compound via solid phase epitaxy (SPE) growth without nucleation.

15. The method of claim 14, further comprising measuring $L_C$ as a function of temperature to provide the calibration curve.

16. The method of claim 15, wherein $L_C = vt^*$, wherein v is a velocity for crystallization of the layer of the amorphous multicomponent ionic compound via SPE growth from the crystalline surface and $t^*$ is a nucleation time of the layer of the amorphous multicomponent ionic compound, and wherein measuring $L_C$ as a function of temperature comprises measuring v as a function of temperature and measuring $t^*$ as a function of temperature.

* * * * *